US012198999B2

(12) United States Patent
Yen et al.

(10) Patent No.: US 12,198,999 B2
(45) Date of Patent: Jan. 14, 2025

(54) ELECTRONIC PACKAGE INCLUDING A PROTECTION LAYER

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 206 days.

(21) Appl. No.: 17/477,238

(22) Filed: Sep. 16, 2021

(65) Prior Publication Data

US 2023/0097299 A1    Mar. 30, 2023

(51) Int. Cl.
*H01L 23/31* (2006.01)
*H01L 23/29* (2006.01)

(52) U.S. Cl.
CPC ........ *H01L 23/3178* (2013.01); *H01L 23/293* (2013.01)

(58) Field of Classification Search
CPC ..... H01L 2224/022–02215; H01L 2224/0391; H01L 23/19822; H01L 23/5383; H01L 23/3178

See application file for complete search history.

(56) References Cited

U.S. PATENT DOCUMENTS

| 2020/0091099 A1* | 3/2020 | Choi | H01L 23/3128 |
| 2020/0152563 A1* | 5/2020 | Chen | H01L 21/486 |
| 2021/0143114 A1* | 5/2021 | Chien | H01L 23/485 |

* cited by examiner

*Primary Examiner* — Laura M Menz
*Assistant Examiner* — Candice Chan
(74) *Attorney, Agent, or Firm* — FOLEY & LARDNER LLP

(57) ABSTRACT

An electronic package includes a carrier, a protection layer and an electronic component. The carrier includes a dielectric layer and a pad in contact with the dielectric layer. The protection layer at least partially covers the pad. The electronic component is located over the protection layer and electrically connected to the pad. At least one portion of the protection layer under the electronic component is substantially conformal with a profile of the pad or with a profile of the dielectric layer.

18 Claims, 28 Drawing Sheets

ELECTRONIC PACKAGE INCLUDING A PROTECTION LAYER

BACKGROUND

1. Field of the Disclosure

The present disclosure relates to an electronic package and a manufacturing method, and to an electronic package including at least one protection layer and a method for manufacturing the electronic package.

2. Description of the Related Art

For the miniaturization of surface mount technology (SMT) components, the resolution of the solder mask is very limited in terms of opening size and pitch. At present, the solder mask is thick. Thus, the fine pitch pads cannot be implemented through exposure and development processes. In addition, the thick solder mask may induce an incomplete contact between the SMT component and the pad. Therefore, during the surface mount process, the surface tension from melted solder may flip one end of the SMT component up (also known as the "tombstone effect"), causing the contact to open. Further, the solder mask has high hygroscopicity, which may induce popcorn and delamination problems in thermal processes, lead to reduced reliability.

SUMMARY

In some embodiments, an electronic package includes a carrier, a protection layer and an electronic component. The carrier includes a dielectric layer and a pad in contact with the dielectric layer. The protection layer at least partially covers the pad. The electronic component is located over the protection layer and electrically connected to the pad. At least one portion of the protection layer under the electronic component is substantially conformal with a profile of the pad or with a profile of the dielectric layer.

In some embodiments, an electronic package includes a carrier, a protection layer, an electronic component and an encapsulant. The carrier includes a dielectric layer and a first pad and a second pad adjacent to the dielectric layer. The protection layer covers the first pad, the second pad and the dielectric layer. The protection layer defines a recess between the first pad and the second pad. The electronic component is located over the recess and electrically connected to the first pad and the second pad by a first interconnection and a second interconnection respectively. The encapsulant extends between the first interconnection and the second interconnection.

In some embodiments, an electronic package includes a substrate and a protection layer. The substrate includes a dielectric layer. The protection layer covers the substrate. A hygroscopicity of the protection layer is less than a hygroscopicity of the dielectric layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
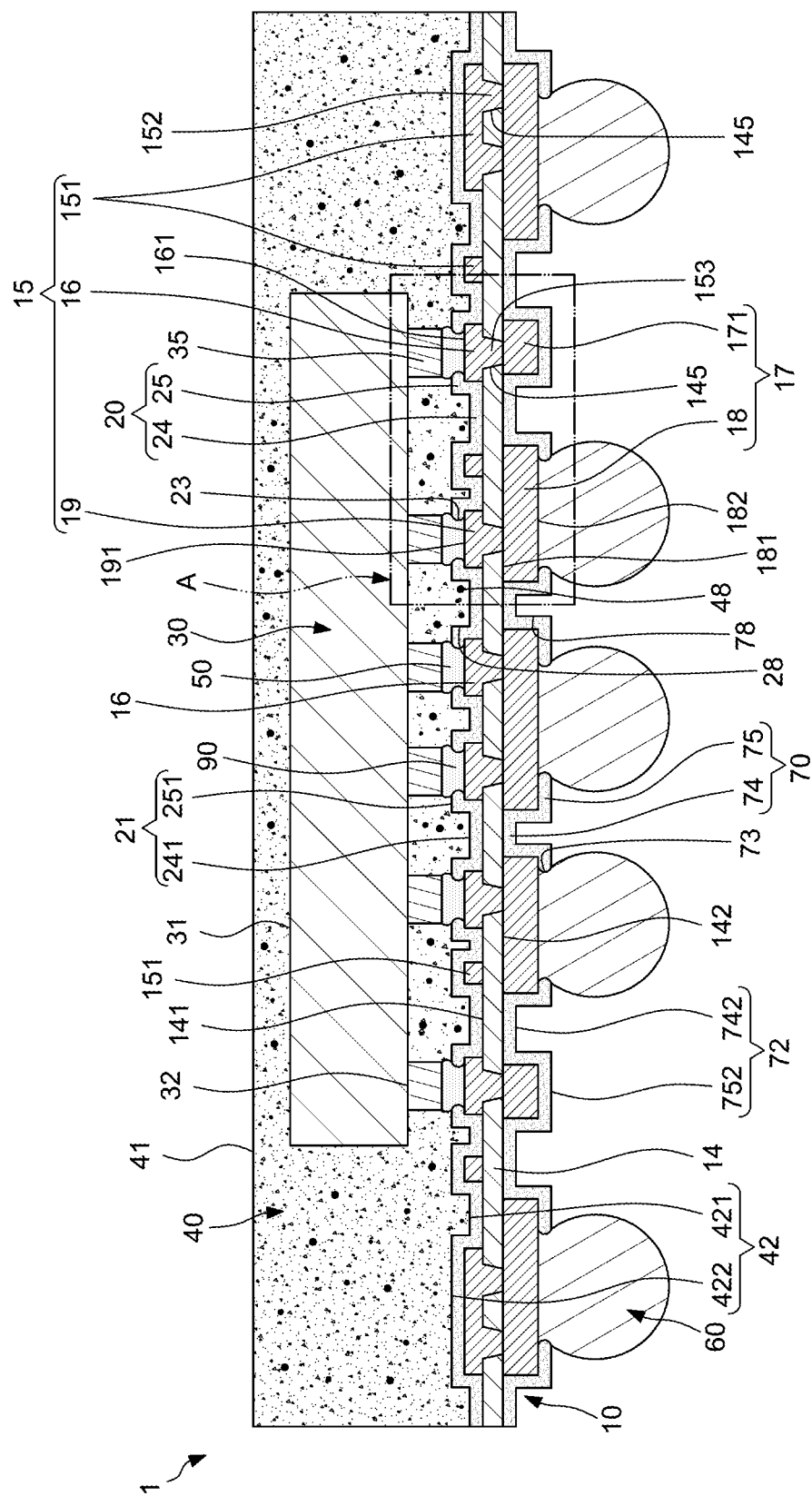
FIG. 1 illustrates a cross-sectional view of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
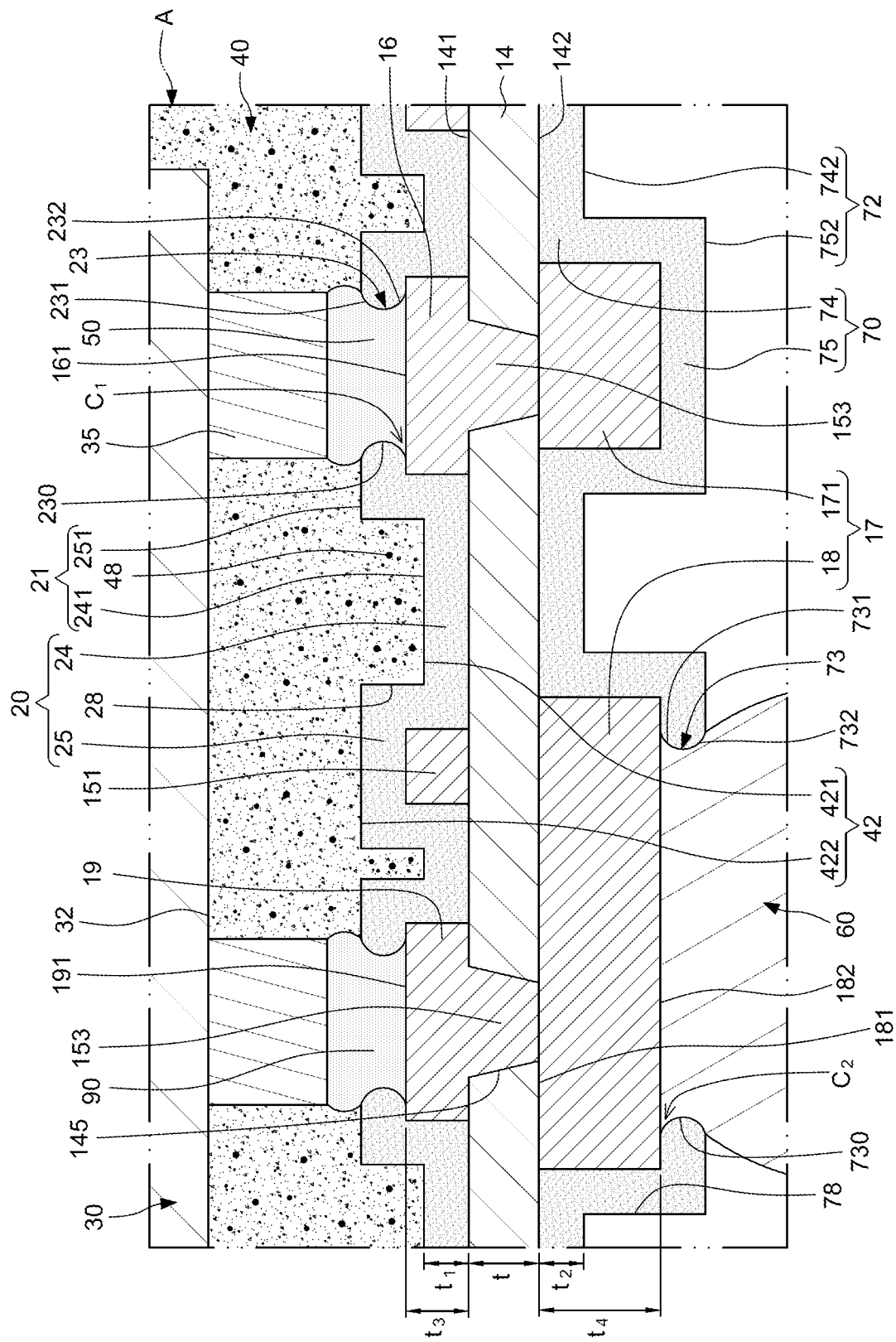
FIG. 2 illustrates an enlarged view of an area "A" of FIG. 1.

FIG. 1 illustrates a cross-sectional view of an electronic package 1 according to some embodiments of the present disclosure. FIG. 2 illustrates an enlarged view of an area "A" of FIG. 1. The electronic package 1 includes a carrier 10, at least one protection layer (including, for example, a first protection layer 20 and a second protection layer 70), at least one electronic component 30, an encapsulant 40, a plurality of interconnections (including, for example, first interconnections 50 and second interconnections 90) and at least one electrical connector 60. In some embodiments, the electronic package 1 may include a plurality of electrical connectors 60 (e.g., solder balls or solder bumps).

The carrier 10 may be also referred to as "substrate." The carrier 10 may include a dielectric layer 14, a first circuit layer 15, a plurality of inner vias (including, for example, inner vias 152 and inner vias 153) and a second circuit layer 17. The dielectric layer 14 may be made of a cured photo-imageable dielectric (PID) material such as epoxy or polyimide (PI) including photoinitiators. The dielectric layer 14 has a top surface 141 and a bottom surface 142 opposite to the top surface 141, and may define a plurality of openings 145 extending through the dielectric layer 14.

The first circuit layer 15 may be formed on, adjacent to, or in contact with the dielectric layer 14. The first circuit layer 15 may include at least one trace 151 and at least one pad (including, for example, first pads 16 and second pads 19). In some embodiments, the first circuit layer 15 may include a plurality of pads (e.g., the first pads 16 and the second pads 19) spaced apart from each other. The trace 151 and the pads (including, for example, the first pads 16 and the second pads 19) may be disposed on, adjacent to, or in contact with the top surface 141 of the dielectric layer 14. In some embodiments, top surfaces (e.g., top surfaces 161 and top surfaces 191) of the pads (including, for example, the first pads 16 and the second pads 19) may be higher than the top surface 141 of the dielectric layer 14.

The inner vias (including, for example, the inner vias 152 and the inner vias 153) may be formed or disposed in the openings 145 of the dielectric layer 14. In some embodiments, some of the inner vias (e.g., the inner vias 152) may electrically connect the trace 151, and some of the inner vias (e.g., the inner vias 153) may electrically connect the pads (including, for example, the first pads 16 and the second pads 19). In some embodiments, the trace 151 and the inner vias 152 may be formed concurrently and integrally, and a width of each of the inner vias 152 may gradually increase toward the trace 151. In some embodiments, the pads (including, for example, the first pads 16 and the second pads 19) and the inner vias 153 may be formed concurrently and integrally, and a width of each of the inner vias 153 may gradually increase toward the corresponding pad (e.g., the first pad 16). As shown in FIG. 1 and FIG. 2, the trace 151, the inner vias 152, the pads (including, for example, the first pads 16 and the second pads 19) and the inner vias 153 may be formed concurrently. The inner vias (including, for example, the inner vias 152 and the inner vias 153) may extend through the dielectric layer 14, and may taper downward.

The second circuit layer 17 may be formed on or contact the bottom surface 142 of the dielectric layer 14. In some embodiments, the second circuit layer 17 may electrically connect the first circuit layer 15. In some embodiments, the second circuit layer 17 may include at least one trace 171 and at least one bonding pad 18. The trace 171 may electrically connect or contact some of the inner vias 153. In some embodiments, a top surface of the trace 171 may be substantially coplanar with a bottom surface of each of the inner vias 153. The bonding pad 18 may be opposite to the pad (e.g., the first pad 16 or the second pad 19).

In some embodiments, the second circuit layer 17 may include a plurality of bonding pads 18. The bonding pads 18 may electrically connect or contact some of the inner vias 153 and some of the inner vias 152. In some embodiments, a top surface of each of the bonding pads 18 may be substantially coplanar with a bottom surface of each of the inner vias 153 or a bottom surface of each of the inner vias 152.

The protection layer (including, for example, the first protection layer 20 and the second protection layer 70) may be, for example, a polymeric insulating membrane. The protection layer (including, for example, the first protection layer 20 and the second protection layer 70) may cover the carrier 10 (including, for example, the dielectric layer 14, the first circuit layer 15 and the second circuit layer 17). That is, the protection layer (including, for example, the first protection layer 20 and the second protection layer 70) may be formed or disposed on the dielectric layer 14. For example, the first protection layer 20 may be formed or disposed on the top surface 141 of the dielectric layer 14 to at least partially cover the first circuit layer 15 (including, for example, the trace 151, the first pads 16 and the second pads 19). Further, the second protection layer 70 may be formed or disposed on the bottom surface 142 of the dielectric layer 14 to at least partially cover the second circuit layer 17 (including, for example, the trace 171 and the bonding pads 18). A material of the protection layer (including, for example, the first protection layer 20 and the second protection layer 70) may include poly-p-xylylene (also referred to as "parylene"). In addition, a hygroscopicity of the protection layer (including, for example, the first protection layer 20 and the second protection layer 70) may be less than a hygroscopicity of the dielectric layer 14 so as to solve the popcorn and delamination problems in thermal processes, lead to increased reliability.

In some embodiments, as shown in FIG. 2, the first protection layer 20 may include a first portion 24 and a second portion 25. The first portion 24 may cover the top surface 141 of the dielectric layer 14. The second portion 25 may be located over and at least partially cover the first circuit layer 15 (including, for example, the trace 151, the first pads 16 and the second pads 19). Thus, the second portion 25 may be higher than the first portion 24. In addition, the second portion 25 and the first portion 24 may define a step structure. In some embodiments, a thickness of the first portion 24 (i.e., the first protection layer 20 on the top surface 141 of the dielectric layer 14) may be substantially equal to a thickness of the second portion 25 (i.e., the first protection layer 20 on the top surfaces (including, for example, the top surfaces 161 and the top surfaces 191) of the pads (including, for example, the first pads 16 and the second pads 19), that is, the entire upper surface 21 of the first protection layer 20 may have a consistent thickness. A level or an elevation of a top surface 241 of the first portion 24 may be lower than a level or an elevation of a top surface 251 of the second portion 25 or a level or an elevation of a top surface (including, for example, the top surface 161 of the first pad 16 and the top surface 191 of the second pad 19) of each of the pads (including, for example, the first pads 16 and the second pads 19). In addition, the first protection layer 20 has an upper surface 21 (including, for example, the top surface 241 of the first portion 24 and the top surface 251 of the second portion 25). In some embodiments, a portion (e.g., the top surface 241 of the first portion 24) of the upper surface 21 of the first protection layer 20 may be lower than the top surface (including, for example, the top surface 161 of the first pad 16 or the top surface 191 of the second pad 19) of each of the pads (including, for example, the first pads 16 and the second pads 19). Further, as shown in FIG. 1 and FIG. 2, the first protection layer 20 may define at least one recess 28 between the pads (e.g., between the first pad 16 and the second pad 19). In some embodiments, the first protection layer 20 may be at least partially substantially conformal with profiles of the first pads 16, profiles of the second pads 19 and a profile of the dielectric layer 14 to define the recess 28. The recess 28 may be above and correspond to the first portion 24 of the first protection layer 20, and a bottom surface of the recess 28 may be lower than the top surface 161 of the first pad 16 or the top surface 191 of the second pad 19. In some embodiments, the first portion 24 of the first protection layer 20 corresponding to the recess 28 may have a uniform thickness. The entire upper surface 21 of the first protection layer 20 may be not a smooth or continuous surface.

In some embodiments, as shown in FIG. 2, a thickness $t_1$ of the first protection layer 20 may be less than a thickness $t_3$ of the first circuit layer 15 (including, for example, the trace 151, the first pads 16 and the second pads 19) and a thickness t of the dielectric layer 14. Thus, as shown in FIG. 1, the first protection layer 20 may be substantially conformal with a profile of the carrier 10 (including, for example, the first circuit layer 15 and the dielectric layer 14). That is, the first protection layer 20 may be substantially conformal with a profile of the trace 151, the profiles of the first pads 16, the profiles of the second pads 19 and a profile of the top surface 141 of the dielectric layer 14.

In some embodiments, as shown in FIG. 2, the first protection layer 20 may define a plurality of first openings 23 extending through the first protection layer 20 (e.g., the second portion 25) to expose portions (e.g., portions of the top surfaces 161 and portions of the top surfaces 191) of the pads (including, for example, the first pads 16 and the second pads 19). In some embodiments, the first openings 23 may be formed by, for example, laser drilling. Thus, as shown in FIG. 2, a sidewall 230 of each of the first openings 23 may curve inward. In addition, each of the first openings 23 may include an upper portion 231 and a lower portion 232 opposite to the upper portion 231. The upper portion 231 may taper downward, and the lower portion 232 may taper upward. That is, a width of the upper portion 231 may gradually decrease toward the corresponding pad (e.g., the first pad 16), and a width of the lower portion 232 may gradually increase toward the corresponding pad (e.g., the first pad 16). The first opening 23 may be in a neck shape. In some embodiments, the sidewall 230 of each of the first openings 23 and the top surface (including, for example, the top surface 161 and the top surface 191) of each of the pads (including, for example, the first pads 16 and the second pads 19) may define a recession $C_1$. An inclination angle between the sidewall 230 of each of the first openings 23 and the top surface (including, for example, the top surface 161 and the top surface 191) of each of the pads (including, for example, the first pads 16 and the second pads 19) may be less than 90 degrees.

In some embodiments, as shown in FIG. 2, the second protection layer 70 may include a first portion 74 and a second portion 75. The first portion 74 may cover the bottom surface 142 of the dielectric layer 14. The second portion 75 may at least partially cover the second circuit layer 17 (including, for example, the trace 171 and the bonding pads 18). Thus, the first portion 74 may be higher than the second portion 75. In some embodiments, a thickness of the first portion 74 may be substantially equal to a thickness of the second portion 75, and a level or an elevation of a bottom surface 742 of the first portion 74 may be higher than a level or an elevation of a bottom surface 752 of the second portion 75. In addition, the second protection layer 70 has a lower surface 72 (including, for example, the bottom surface 742 of the first portion 74 and the bottom surface 752 of the second portion 75). In some embodiments, a portion (e.g., the bottom surface 742 of the first portion 74) of the lower surface 72 of the second protection layer 70 may be higher than a bottom surface 182 of each of the bonding pads 18. Further, as shown in FIG. 1, the second protection layer 70 may define at least one cavity 78 between the bonding pads 18. In some embodiments, the cavity 78 may be below the first portion 74 of the second protection layer 70. In some embodiments, a top surface 181 of each of the bonding pads 18 may be substantially coplanar with the bottom surface 142 of the dielectric layer 14.

In some embodiments, as shown in FIG. 2, a thickness $t_2$ of the second protection layer 70 may be less than a thickness $t_4$ of the second circuit layer 17 (including, for example, the trace 171 and the bonding pads 18) and the thickness t of the dielectric layer 14. Thus, as shown in FIG. 1, the second protection layer 70 may be substantially conformal with a profile of the second circuit layer 17. That is, the second protection layer 70 may be substantially conformal with a profile of the trace 171, profiles of the bonding pads 18 and a profile of the bottom surface 142 of the dielectric layer 14.

In some embodiments, as shown in FIG. 2, the second protection layer 70 may define a plurality of first openings 73 extending through the second protection layer 70 (e.g., the second portion 75) to expose a portion (e.g., a portion of the bottom surface 182) of each of the bonding pads 18. In some embodiments, the first openings 73 may be formed by, for example, laser drilling. Thus, as shown in FIG. 2, a sidewall 730 of each of the first openings 73 may curve inward. In addition, each of the first openings 73 may include an upper portion 731 and a lower portion 732 opposite to the upper portion 731. The upper portion 731 may taper downward, and the lower portion 732 may taper upward. That is, a width of the upper portion 731 may gradually increase toward the corresponding bonding pad 18, and a width of the lower portion 732 may gradually decrease toward the corresponding bonding pad 18. The first opening 73 may be in a neck shape. In some embodiments, the sidewall 730 of each of the first openings 73 and the bottom surface 182 of each of the bonding pads 18 may define a recession $C_2$. An inclination angle between the sidewall 730 of each of the first openings 73 and the bottom surface 182 of each of the bonding pads 18 may be less than 90 degrees.

The electronic component 30 may be, for example, a semiconductor die, a resister, a capacitor or an inductor. The electronic component 30 may be located over the first protection layer 20 (including, for example, the first portion 24, the second portion 25 and the recess 28) and electrically connected to the exposed portions (e.g., the exposed portions of the top surfaces 161 and the exposed portions of the top surfaces 191) of the pads (including, for example, the first pads 16 and the second pads 19) by the interconnections (e.g., the first interconnections 50 and the second interconnections 90). In some embodiments, the interconnections (e.g., the first interconnections 50 and the second interconnections 90) may include solder material. In some embodiments, the second portion 25 may be closer to the interconnections (including, for example, the first interconnections 50 and the second interconnections 90) between the electronic component 30 and the pads (including, for example, the first pads 16 and the second pads 19) than the first portion 24 is. That is, a distance between the electronic component 30 and the first portion 24 (i.e., the first protection layer 20 on the dielectric layer 14) may be greater than a distance between the electronic component and the second portion 25 (i.e., the first protection layer 20 on the pads (including, for example, the first pads 16 and the second pads 19)). The electronic component 30 has an upper surface 31 (e.g., back side surface) and a lower surface 32 (e.g., active surface) opposite to the upper surface 31, and may include a plurality of conductive pads 35 disposed adjacent to the lower surface 32. The interconnections (including, for example, the first interconnections 50 and the second interconnections 90) may be disposed between the conductive pads 35 and the pads (including, for example, the first pads 16 and the second pads 19) to bond both together. In some embodiments, as shown in FIG. 2, a portion of each of the interconnections (including, for example, the first interconnections 50 and the second interconnections 90) may be disposed in the first opening 23 and may extend into the recession $C_1$ to engage with the first protection layer 20. The portion of each of the interconnections (including, for example, the first interconnections 50 and the second interconnections 90) in the first opening 23 may include an upper portion and a lower portion opposite to the upper portion. The upper portion may taper downward, and the lower portion may taper upward. That is, a width of the upper portion may gradually decrease toward the corresponding pad (e.g., the first pad 16 or the second pad 19), and a width of the lower portion may gradually increase toward the corresponding pad (e.g., the first pad 16 or the second pad 19). The portion of each of the interconnections (including, for example, the first interconnections 50 and the second interconnections 90) in the first opening 23 may be in a neck shape. A wedge angle of the portion of each of the interconnections (including, for example, the first interconnections 50 and the second interconnections 90) in the recession $C_1$ may be less than 90 degrees. In some embodiments, the recess 28 of the first protection layer 20 may be below the electronic component 30. The first portion 24 of the first protection layer 20 under the electronic component 30 may be substantially conformal with the profile of the trace 151 and the profiles of the pads (including, for example, the first pads 16 and the second pads 19). The second portion 25 of the first protection layer 20 under the electronic component 30 may be substantially conformal with the profile of the dielectric layer 14. In some embodiments, as shown in FIG. 1, the pads (including, for example, the first pads 16 and the second pads 19) and the dielectric layer 14 may collectively define a step portion. The first portion 24 and the second portion 25 of the first protection layer 20 under the electronic component 30 may be substantially conformal with the step portion.

The encapsulant 40 encapsulates the electronic component 30, the first protection layer 20 and the interconnections (including, for example, the first interconnections 50 and the second interconnections 90). A material of the encapsulant 40 may be a molding compound with fillers. In some embodiments, a portion of the encapsulant 40 may extend between the interconnections (e.g., between the first interconnection 50 and the second interconnection 90), between the pads (e.g., between the first pad 16 and the second pad 19) and into the recess 28 of the first protection layer 20. That is, the portion of the encapsulant 40 may fill the recess 28. The encapsulant 40 has an upper surface 41 and a lower surface 42 opposite to the upper surface 41. The lower surface 42 of the encapsulant 40 may include a first portion 421 and a second portion 422 higher than the first portion 421. In some embodiments, as shown in FIG. 2, the first portion 421 of the lower surface 42 may be lower than the top surface (including, for example, the top surface 161 and the top surface 191) of each of the pads (including, for example, the first pads 16 and the second pads 19) and substantially coplanar with the top surface 241 of the first portion 24 of the first protection layer 20. The second portion 422 of the lower surface 42 may be substantially coplanar with the top surface 251 of the second portion 25 of the first protection layer 20.

In some embodiments, as shown in FIG. 2, the encapsulant 40 may include at least one filler 48 in the recess 28. A dimension of the at least one filler 48 may be less than a gap between the electronic component 30 and the recess 28 of the first protection layer 20. The at least one filler 48 in the recess 28 may be spaced apart from the electronic component 30 or the first protection layer 20. The at least one filler 48 may be ball, spheroid, ellipsoid or other geometrical shape. In some embodiments, the encapsulant 40 may include a plurality of fillers 48. The plurality of fillers 48 may have different sizes.

The electrical connectors 60 are disposed in the first openings 73 of the second protection layer 70 and electrically connected to the exposed portions (e.g., the exposed portions of the bottom surfaces 182) of the bonding pads 18 for external connection. In some embodiments, as shown in FIG. 2, each of the electrical connectors 60 may extend into the recession $C_2$ to engage with the second protection layer 70. In some embodiments, the electrical connectors 60 may include solder material.

In the embodiment illustrated in FIG. 1 to FIG. 2, a thickness of the protection layer (including, for example, the first protection layer 20 and the second protection layer 70) may be thicker than or equal to about 30 µm, 20 µm, 10 µm, or 5 µm. In some embodiments, the thickness of the protection layer (including, for example, the first protection layer 20 and the second protection layer 70) may be about 3 µm to about 10 µm. Further, the protection layer (including, for example, the first protection layer 20 and the second protection layer 70) may be formed by deposition rather than by lamination. Thus, the protection layer (including, for example, the first protection layer 20 and the second protection layer 70) may not break or damage the first circuit layer 15 and the second circuit layer 17. In addition, the protection layer (including, for example, the first protection layer 20 and the second protection layer 70) may substantially conformal with the profile of the first circuit layer 15 (including, for example, the trace 151, the first pads 16 and the second pads 19) (e.g., the first protection layer 20) and the profile of the second circuit layer 17 (including, for example, the trace 171 and the bonding pads 18) (e.g., the second protection layer 70) to implement the fine pitch pads and prevent the electronic component 30 from generating tombstone effects during the surface mount process.

Figure 3:
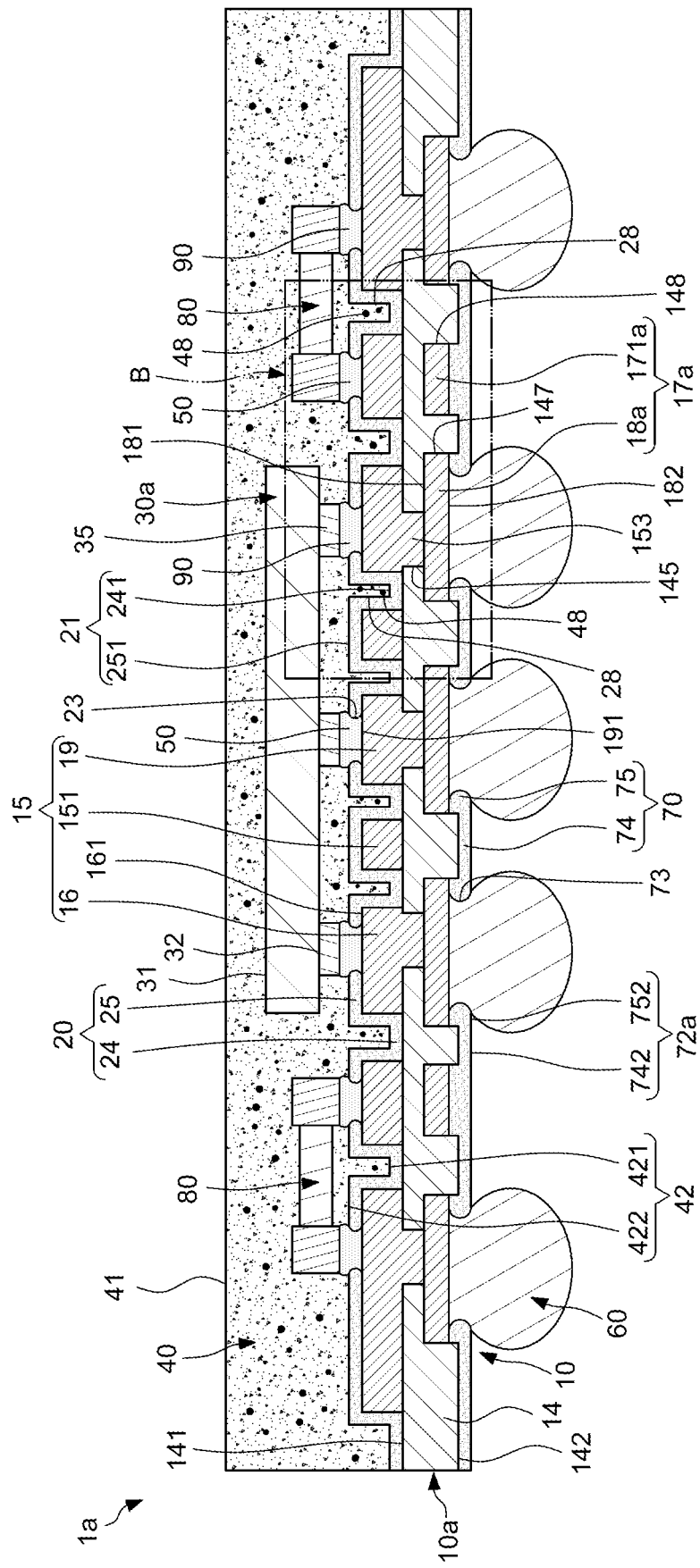
FIG. 3 illustrates a cross-sectional view of an electronic package according to some embodiments of the present disclosure.
Figure 4:
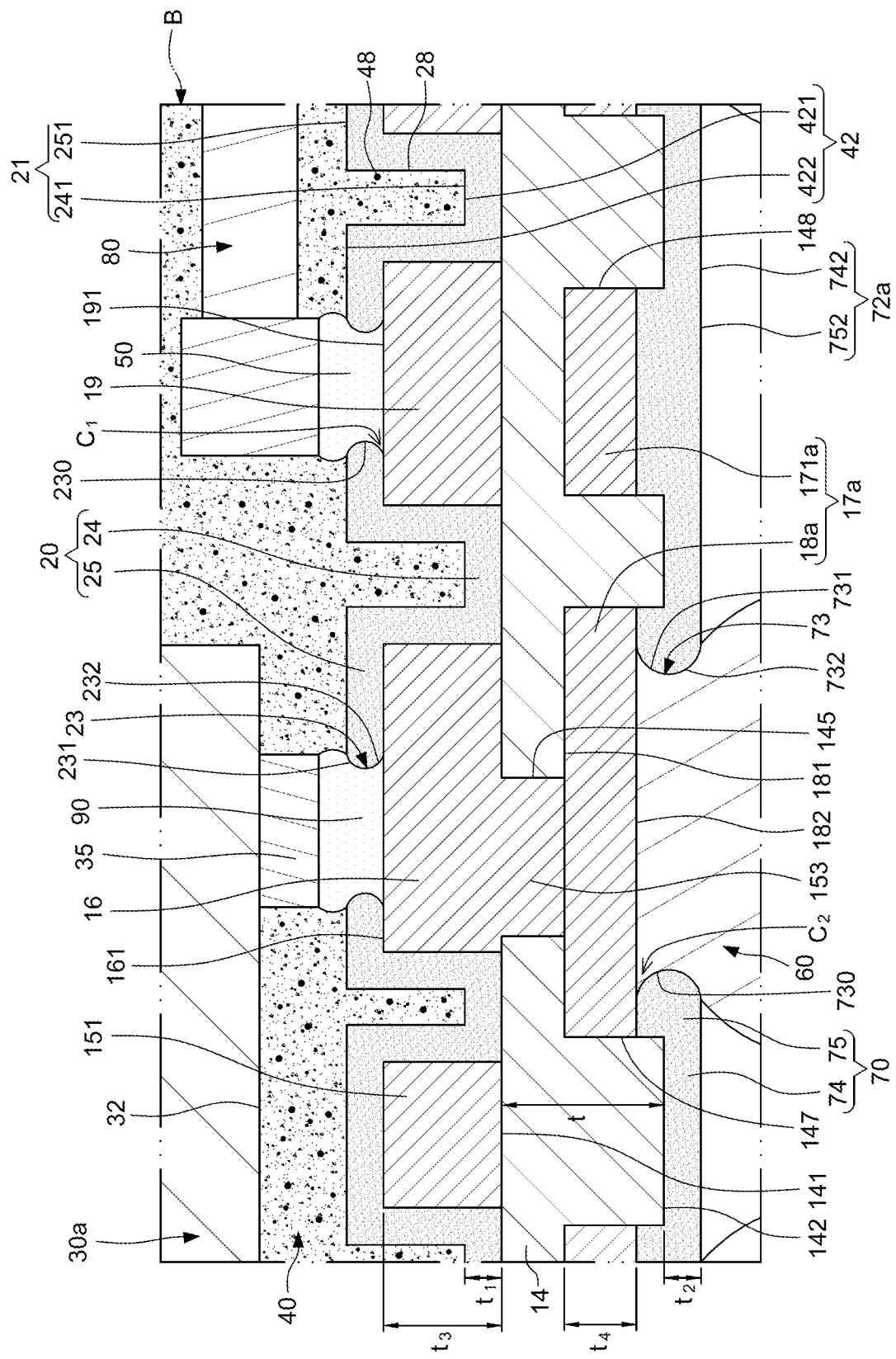
FIG. 4 illustrates an enlarged view of an area "B" of FIG. 3.

FIG. 3 illustrates a cross-sectional view of an electronic package 1a according to some embodiments of the present disclosure. FIG. 4 illustrates an enlarged view of an area "B" of FIG. 3. The electronic package 1a of FIG. 3 is similar to the electronic package 1 of FIG. 1, except for a structure of the carrier 10a. As shown in FIG. 3, the dielectric layer 14 of the carrier 10a further defines a plurality of first accommodating cavities 147 and at least one second accommodating cavity 148. The first accommodating cavities 147 may be recessed from the bottom surface 142 and in communication with the openings 145 of the dielectric layer 14. The second accommodating cavity 148 may also be recessed from the bottom surface 142 and between the first accommodating cavities 147. The second accommodating cavity 148 may be not in communication with the opening 145 of the dielectric layer 14.

The bonding pads 18a of the second circuit layer 17a may be disposed in the first accommodating cavities 147 and electrically connect the inner vias 153 in the openings 145. In some embodiments, a thickness of each of the bonding pads 18a may be less than a depth of each of the first accommodating cavities 147. Thus, the bonding pads 18a may be higher than the bottom surface 142 of the dielectric layer 14 and between the top surface 141 and the bottom surface 142 of the dielectric layer 14. That is, the bottom surface 182 of each of the bonding pads 18a may be non-coplanar with the bottom surface 142 of the dielectric layer 14.

The trace 171a of the second circuit layer 17a may be disposed in the second accommodating cavity 148. In some embodiments, a thickness of the trace 171a may be less than a depth of the second accommodating cavity 148. Thus, the trace 171a may be higher than the bottom surface 142 of the dielectric layer 14 and between the top surface 141 and the bottom surface 142 of the dielectric layer 14. That is, a bottom surface of the trace 171a may be non-coplanar with the bottom surface 142 of the dielectric layer 14.

As shown in FIG. 3, the lower surface 72a of the second protection layer 70 may be a flat surface. That is, the bottom surface 742 of the first portion 74 may be substantially coplanar with the bottom surface 752 of the second portion 75.

In addition, the electronic package 1a may include a plurality of electronic components (including, for example, one first electronic component 30a and two second electronic components 80). The first electronic component 30a may be, for example, a semiconductor die. The second electronic components 80 may be, for example, a resister, a capacitor or an inductor.

FIG. 5 through FIG. 15 illustrate a method for manufacturing an electronic package according to some embodiments of the present disclosure. In some embodiments, the method is for manufacturing the electronic package 1 shown in FIG. 1.

Figure 5:
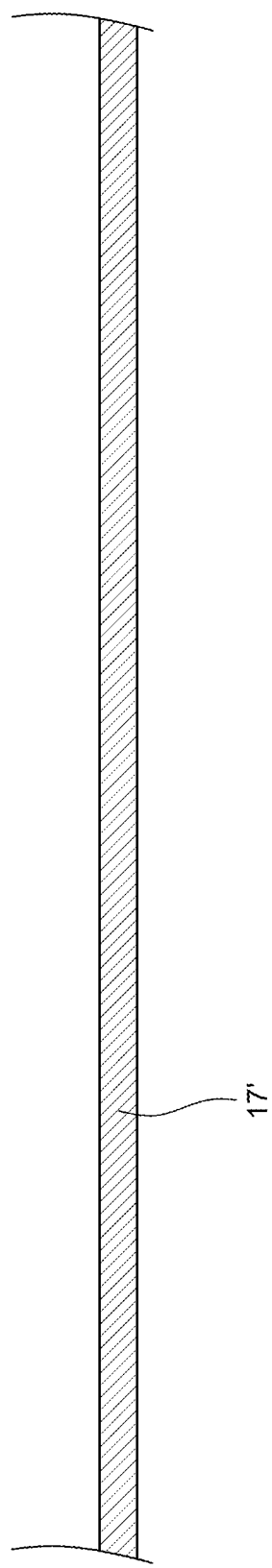
FIG. 5 illustrates one or more stages of an example of a method for manufacturing an electronic package according to some embodiments of the present disclosure.

Referring to FIG. 5 through FIG. 10, a carrier 10' is provided. Referring to FIG. 5, a metal plate 17' is provided.

Figure 6:
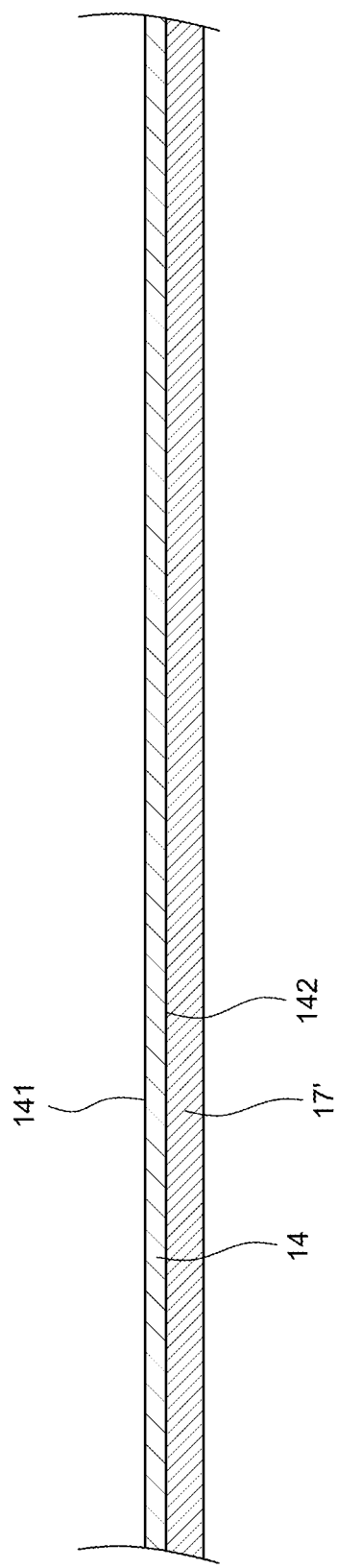
FIG. 6 illustrates one or more stages of an example of a method for manufacturing an electronic package according to some embodiments of the present disclosure.

Referring to FIG. 6, a dielectric layer 14 is formed on the metal plate 17'. The dielectric layer 14 may be made of a cured photoimageable dielectric (PID) material such as epoxy or polyimide (PI) including photoinitiators. The dielectric layer 14 has a top surface 141 and a bottom surface 142 opposite to the top surface 141.

Figure 7:
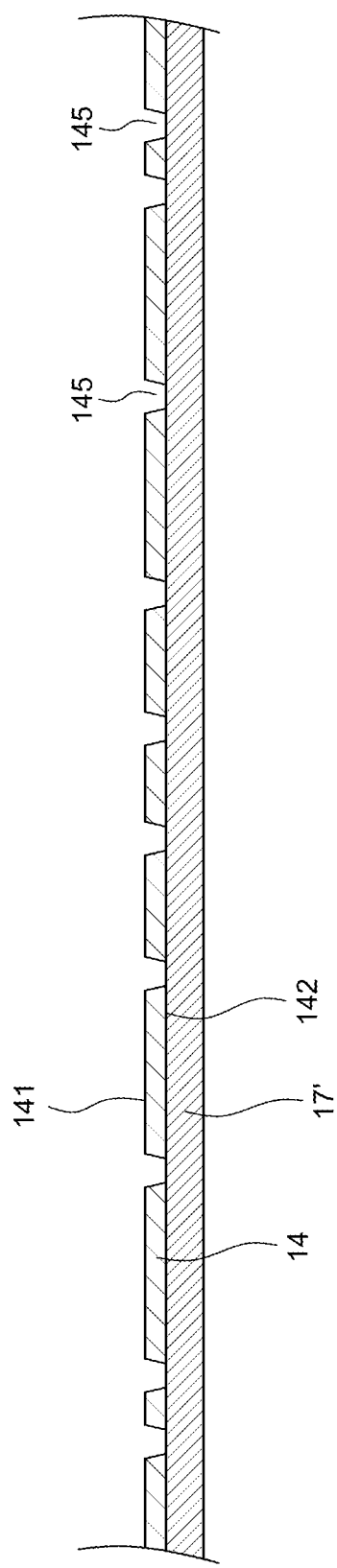
FIG. 7 illustrates one or more stages of an example of a method for manufacturing an electronic package according to some embodiments of the present disclosure.

Referring to FIG. 7, the dielectric layer 14 is patterned to form a plurality of openings 145 extending through the dielectric layer 14 to expose portions of the metal plate 17' by an exposure and development technique or other suitable techniques.

Figure 8:
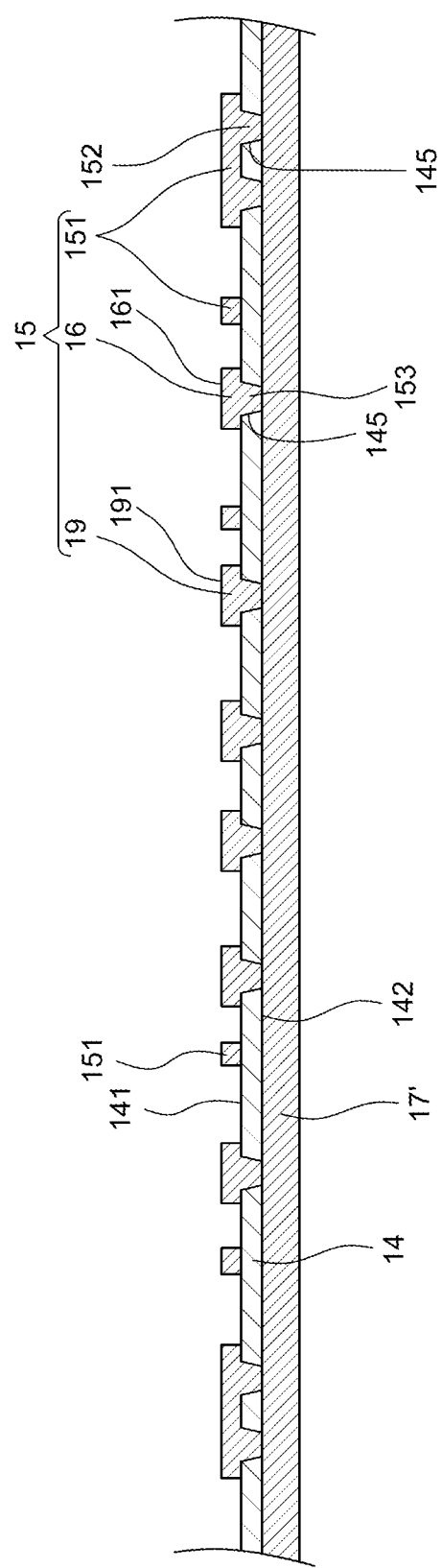
FIG. 8 illustrates one or more stages of an example of a method for manufacturing an electronic package according to some embodiments of the present disclosure.

Referring to FIG. 8, a first circuit layer 15 and a plurality of inner vias (including, for example, inner vias 152 and inner vias 153) are formed. The first circuit layer 15 is formed on the top surface 141 of the dielectric layer 14. The first circuit layer 15 includes at least one trace 151 and a plurality of pads (including, for example, first pads 16 and second pads 19) spaced apart from each other. The inner vias (including, for example, the inner vias 152 and the inner vias 153) are formed in the openings 145 of the dielectric layer 14 and on the exposed portions of the metal plate 17'. In addition, some of the inner vias (e.g., the inner vias 152) are electrically connected to the trace 151, and some of the inner vias (e.g., the inner vias 153) are electrically connected to the pads (including, for example, the first pads 16 and the second pads 19).

Figure 9:
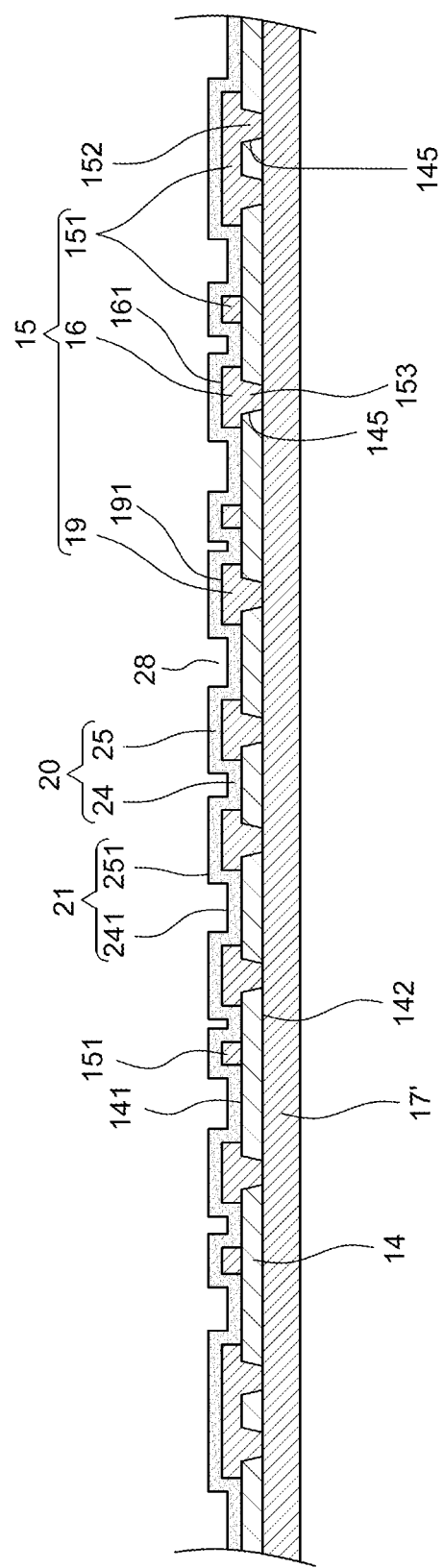
FIG. 9 illustrates one or more stages of an example of a method for manufacturing an electronic package according to some embodiments of the present disclosure.

Referring to FIG. 9, a first protection layer 20 is formed on the dielectric layer 14 to cover the top surface 141 of the dielectric layer 14 and the first circuit layer 15 (including, for example, the trace 151, the first pads 16 and the second pads 19) by, for example, chemical vapor deposition (CVD). A material of the first protection layer 20 may include poly-p-xylylene (also referred to as "parylene"). In addition, a hygroscopicity of the first protection layer 20 is less than a hygroscopicity of the dielectric layer 14 so as to solve the popcorn and delamination problems in thermal processes, lead to increased reliability.

The first protection layer 20 includes a first portion 24 and a second portion 25. The first portion 24 covers the top surface 141 of the dielectric layer 14. The second portion 25 at least partially covers the first circuit layer 15 (including, for example, the trace 151 the first pads 16 and the second pads 19). Thus, the first portion 24 is lower than the second portion 25. In addition, the first protection layer 20 has an upper surface 21 (including, for example, a top surface 241 of the first portion 24 and a top surface 251 of the second portion 25). A portion (e.g., the top surface 241 of the first portion 24) of the upper surface 21 of the first protection layer 20 is lower than a top surface (including, for example, the top surface 161 and the top surface 191) of each of the pads (including, for example, the first pads 16 and the second pads 19). Further, as shown in FIG. 9, at least one recess 28 is formed between the pads (e.g., between the first pad 16 and the second pad 19). The recess 28 is above the first portion 24 of the first protection layer 20.

As shown in FIG. 2, a thickness $t_1$ of the first protection layer 20 is less than a thickness $t_3$ of the first circuit layer 15 (including, for example, the trace 151, the first pads 16 and the second pads 19) and a thickness t of the dielectric layer 14. Thus, as shown in FIG. 9, the first protection layer 20 is substantially conformal with a profile of the first circuit layer 15. That is, the first protection layer 20 is substantially conformal with a profile of the trace 151, profiles of the first pads 16 and profiles of the second pads.

Figure 10:
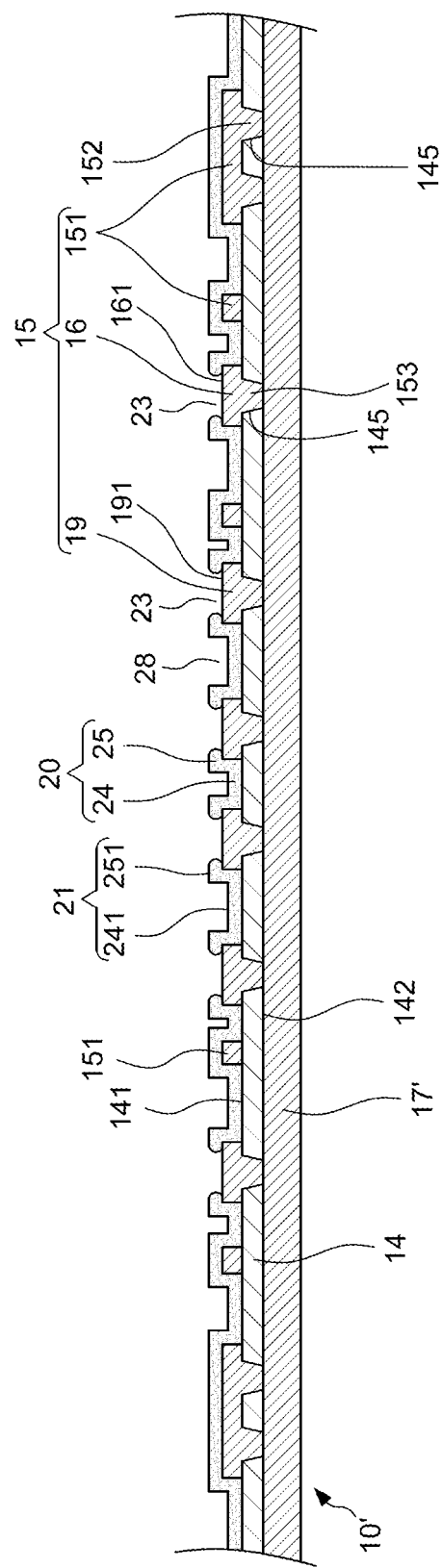
FIG. 10 illustrates one or more stages of an example of a method for manufacturing an electronic package according to some embodiments of the present disclosure.

Referring to FIG. 10 and FIG. 2, the first protection layer 20 is patterned to form a plurality of first openings 23 extending through the first protection layer 20 (e.g., the second portion 25) to expose portions of the pads (including, for example, the first pads 16 and the second pads 19) by, for example, laser drilling. Meanwhile, the carrier 10' is formed. As shown in FIG. 2, a sidewall 230 of each of the first openings 23 curves inward due to laser drilling. In addition, each of the first openings 23 includes an upper portion 231 and a lower portion 232 opposite to the upper portion 231. The upper portion 231 tapers downward, and the lower portion 232 tapers upward. That is, a width of the upper portion 231 gradually decreases toward the corresponding pad (e.g., the first pad 16), and a width of the lower portion 232 gradually increases toward the corresponding pad (e.g., the first pad 16). Further, the sidewall 230 of each of the first openings 23 and the top surface (including, for example, the top surface 161 and the top surface 191) of each of the pads (including, for example, the first pads 16 and the second pads 19) define a recession $C_1$.

Figure 11:
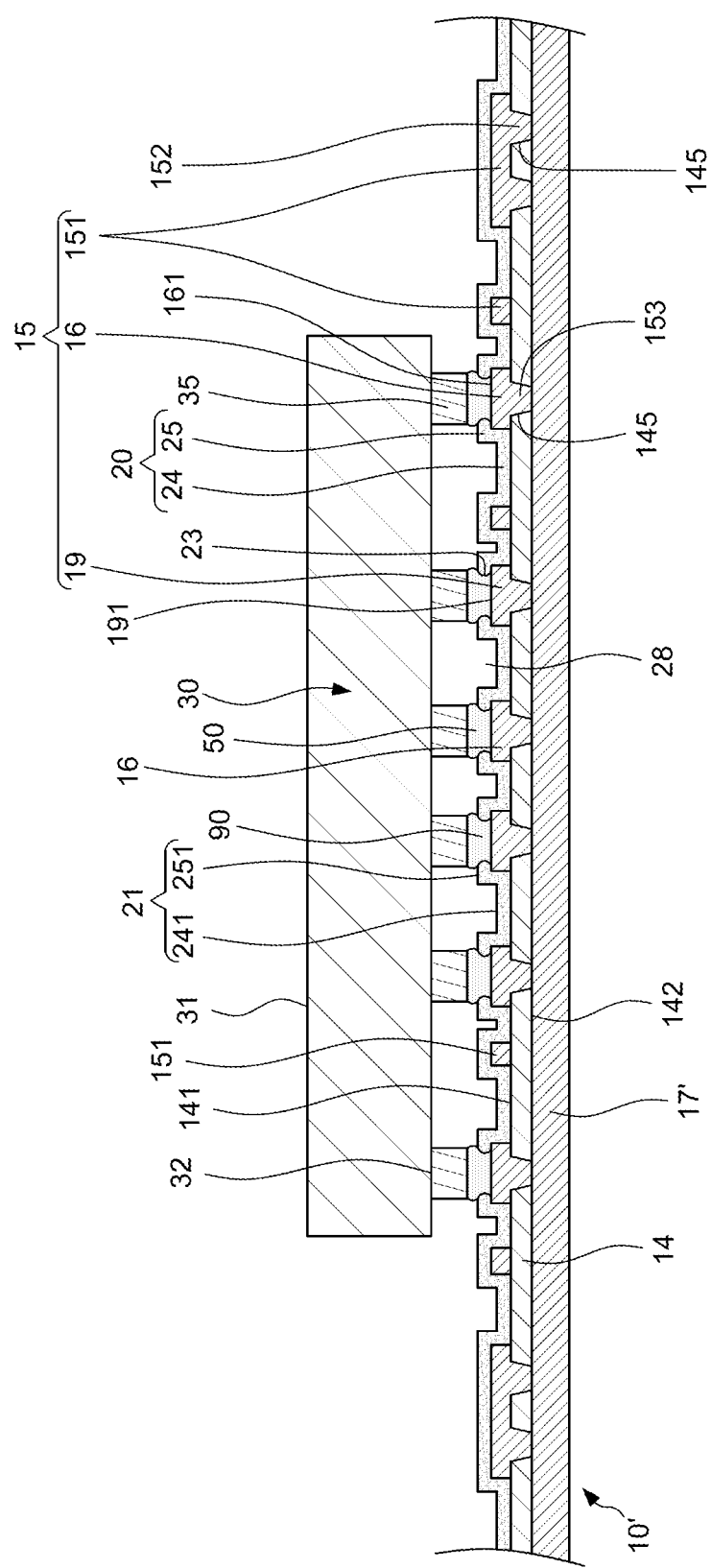
FIG. 11 illustrates one or more stages of an example of a method for manufacturing an electronic package according to some embodiments of the present disclosure.

Referring to FIG. 11 and FIG. 2, at least one electronic component 30 is electrically connected to the exposed portions of the pads (including, for example, the first pads 16 and the second pads 19) of the first circuit 15 by a plurality of interconnections (including, for example, first interconnections 50 and second interconnections 90). The electronic component 30 may be, for example, a semiconductor die, a resister, a capacitor or an inductor. The electronic component 30 has an upper surface 31 (e.g., back side surface) and a lower surface 32 (e.g., active surface) opposite to the upper surface 31, and includes a plurality of conductive pads 35 disposed adjacent to the lower surface 32. The interconnections (including, for example, the first interconnections 50 and the second interconnections 90) are disposed between the conductive pads 35 and the pads (including, for example, the first pads 16 and the second pads 19) to bond both together. As shown in FIG. 2, the interconnections (including, for example, the first interconnections 50 and the second interconnections 90) extend into the recessions $C_1$ to engage with the first protection layer 20. In addition, the recess 28 of the first protection layer 20 is below the electronic component 30.

Figure 12:
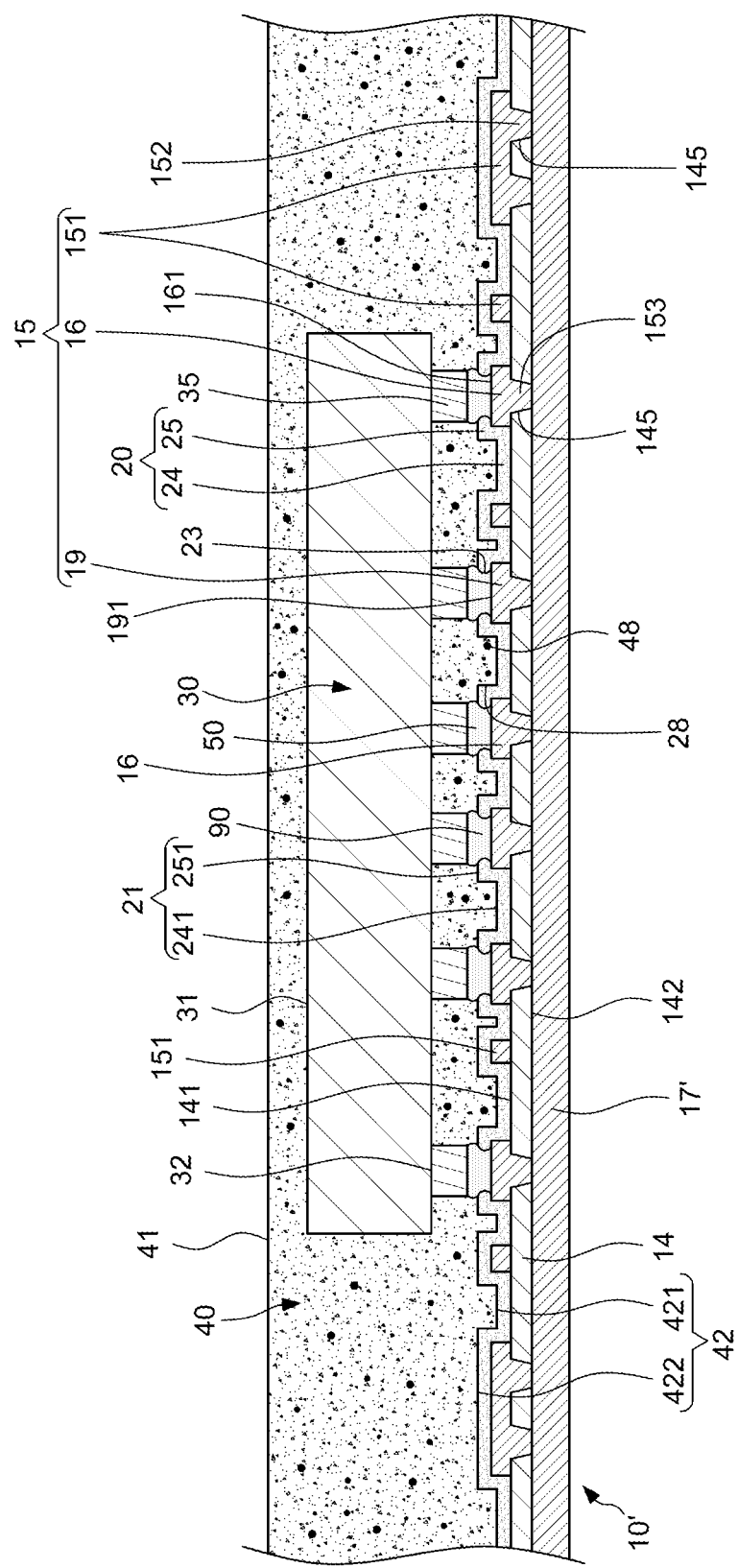
FIG. 12 illustrates one or more stages of an example of a method for manufacturing an electronic package according to some embodiments of the present disclosure.

Referring to FIG. 12, an encapsulant 40 is formed on the carrier 10' to encapsulate the electronic component 30, the first protection layer 20 and the interconnections (including, for example, the first interconnections 50 and the second interconnections 90). A material of the encapsulant 40 may be a molding compound with or without fillers. A portion of the encapsulant 40 extends between the pads (e.g., between the first pad 16 and the second pad 19) and into the recess 28 of the first protection layer 20. That is, the portion of the encapsulant 40 fills the recess 28. The encapsulant 40 has an upper surface 41 and a lower surface 42 opposite to the upper surface 41. The lower surface 42 of the encapsulant 40 includes a first portion 421 and a second portion 422 higher than the first portion 421. The first portion 421 of the lower surface 42 is lower than the top surface (including, for example, the top surface 161 and the top surface 191) of each of the pads (including, for example, the first pads 16 and the second pads 19) and substantially coplanar with the top surface 241 of the first portion 24 of the first protection layer 20. The second portion 422 of the lower surface 42 is substantially coplanar with the top surface 251 of the second portion 25 of the first protection layer 20.

Figure 13:
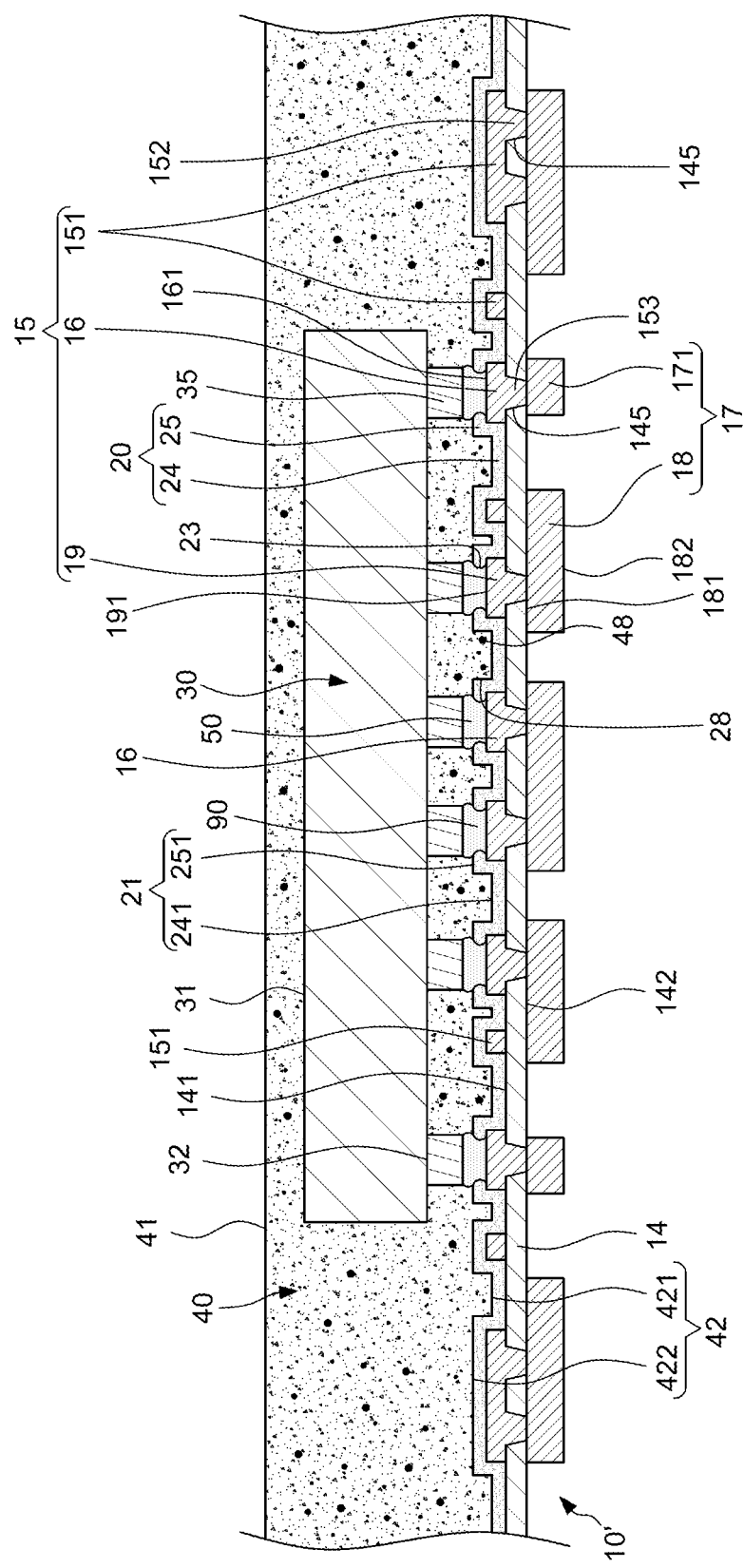
FIG. 13 illustrates one or more stages of an example of a method for manufacturing an electronic package according to some embodiments of the present disclosure.

Referring to FIG. 13, the metal plate 17' is patterned to form a second circuit layer 17 by, for example, etching. The second circuit layer 17 includes at least one trace 171 and a plurality of bonding pads 18. The bonding pads 18 electrically connect or contact some of the inner vias 153 and some of the inner vias 152. A top surface of each of the bonding pads 18 is substantially coplanar with a bottom surface of each of the inner vias 153 or a bottom surface of each of the inner vias 152. The trace 171 electrically connects or contacts some of the inner vias 153. A top surface of the trace 171 is substantially coplanar with a bottom surface of each of the inner vias 153.

Figure 14:
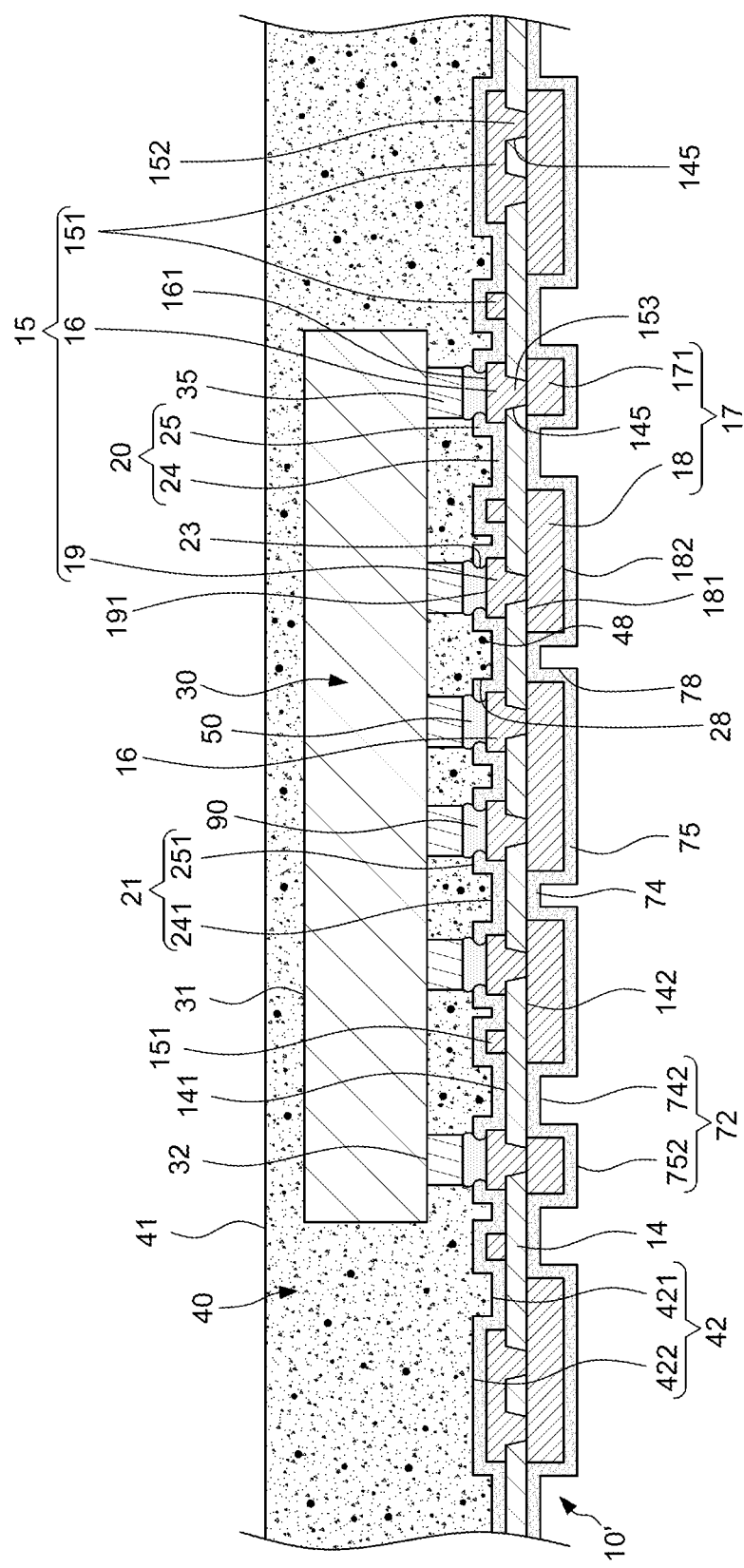
FIG. 14 illustrates one or more stages of an example of a method for manufacturing an electronic package according to some embodiments of the present disclosure.

Referring to FIG. 14 and FIG. 2, a second protection layer 70 is formed to cover the bottom surface 142 of the dielectric layer 14 and the second circuit layer 17 (including, for example, the trace 171 and the bonding pads 18) by, for example, chemical vapor deposition (CVD). A material of the second protection layer 70 may include poly-p-xylylene (also referred to as "parylene"). In addition, a hygroscopicity of the second protection layer 70 is less than the hygroscopicity of the dielectric layer 14 so as to solve the popcorn and delamination problems in thermal processes, lead to increased reliability.

The second protection layer 70 includes a first portion 74 and a second portion 75. The first portion 74 covers the bottom surface 142 of the dielectric layer 14. The second portion 75 at least partially covers the second circuit layer 17 (including, for example, the trace 171 and the bonding pads 18). Thus, the first portion 74 is higher than the second portion 75. In addition, the second protection layer 70 has a lower surface 72 (including, for example, a bottom surface 742 of the first portion 74 and a bottom surface 752 of the second portion 75). A portion (e.g., the bottom surface 742 of the first portion 74) of the lower surface 72 of the second protection layer 70 is higher than a bottom surface 182 of each of the bonding pads 18. Further, as shown in FIG. 14, at least one cavity 78 is formed between the bonding pads 18. The cavity 78 is below the first portion 74 of the second protection layer 70.

As shown in FIG. 2, a thickness $t_2$ of the second protection layer 70 is less than a thickness $t_4$ of the second circuit layer 17 (including, for example, the trace 171 and the bonding pads 18) and the thickness t of the dielectric layer 14. Thus, as shown in FIG. 14, the second protection layer 70 is substantially conformal with a profile of the second circuit layer 17. That is, the second protection layer 70 is substantially conformal with a profile of the trace 171 and profiles of the bonding pads 18.

Figure 15:
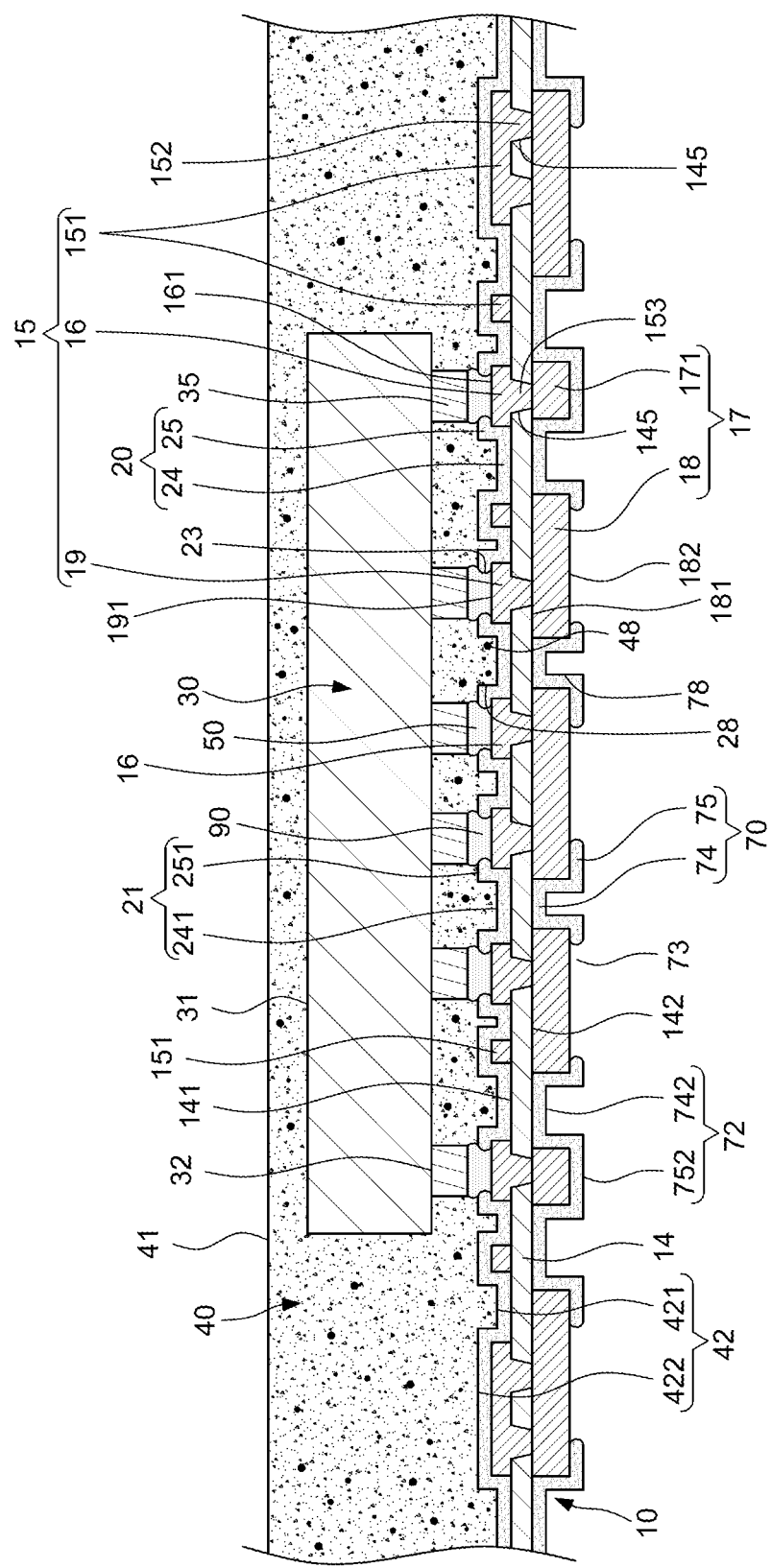
FIG. 15 illustrates one or more stages of an example of a method for manufacturing an electronic package according to some embodiments of the present disclosure.

Referring to FIG. 15 and FIG. 2, the second protection layer 70 is patterned to form a plurality of second openings 73 extending through the second protection layer 70 (e.g., the second portion 75) to expose portions (e.g., portions of the bottom surfaces 182) of the bonding pads 18 by, for example, laser drilling. Meanwhile, the carrier 10 is formed. As shown in FIG. 2, a sidewall 730 of each of the first openings 73 curves inward due to laser drilling. In addition, each of the first openings 73 includes an upper portion 731 and a lower portion 732 opposite to the upper portion 731. The upper portion 731 tapers downward, and the lower portion 732 tapers upward. That is, a width of the upper portion 731 gradually increases toward the corresponding bonding pad 18, and a width of the lower portion 732 gradually decreases toward the corresponding bonding pad 18. Further, the sidewall 730 of each of the first openings 73 and the bottom surface 182 of each of the bonding pads 18 define a recession $C_2$.

Figure 16:
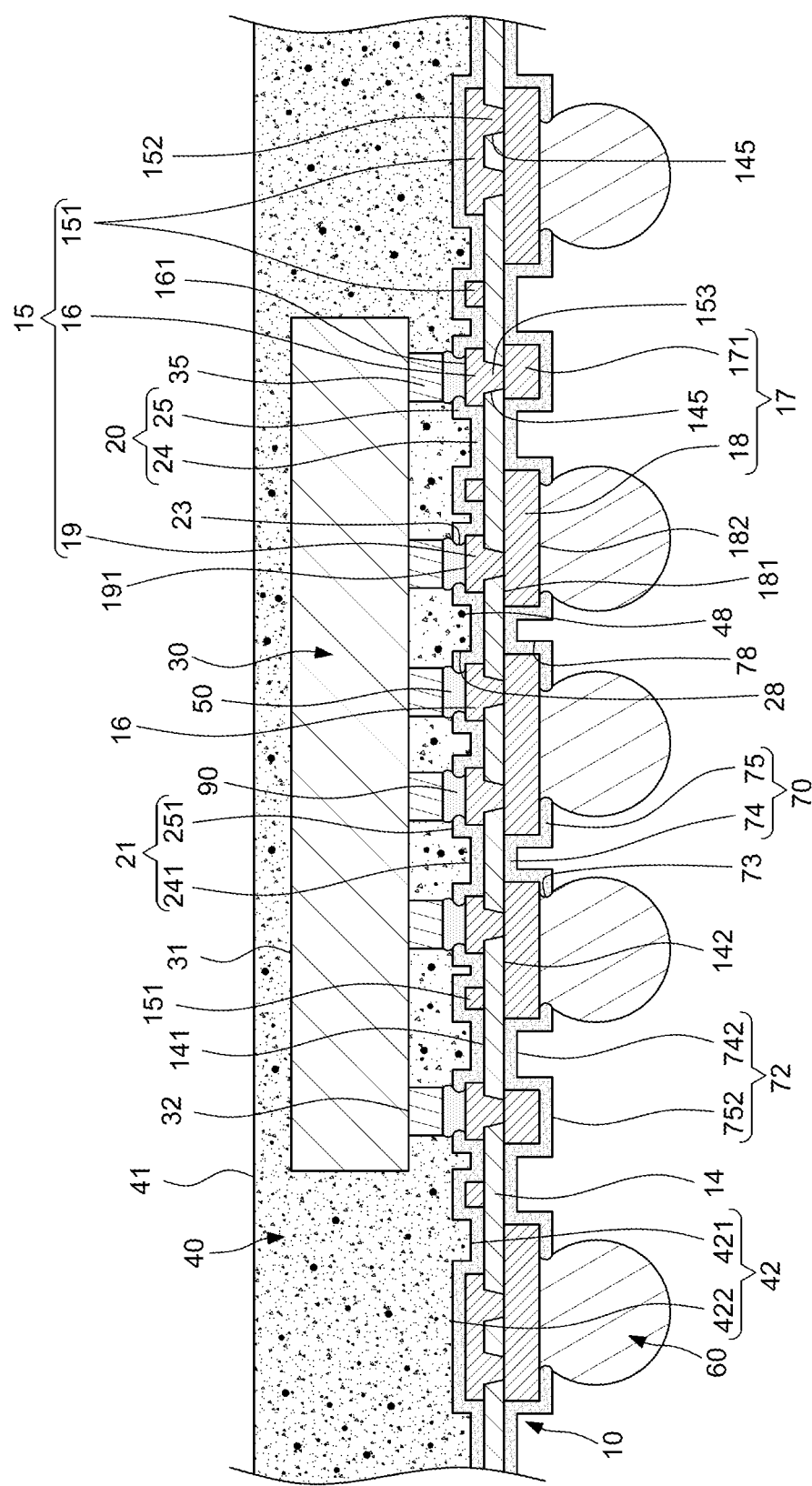
FIG. 16 illustrates one or more stages of an example of a method for manufacturing an electronic package according to some embodiments of the present disclosure.

Referring to FIG. 16 and FIG. 2, a plurality of electrical connectors 60 are formed or disposed in the second openings 73 of the second protection layer 70 and mounted on the exposed portions (e.g., the exposed portions of the bottom surfaces 182) of the bonding pads 18 for external connection. In addition, as shown in FIG. 2, each of the electrical connectors 60 extends into the recession $C_2$ to engage with the second protection layer 70.

Then, a singulation process is conducted to obtain a plurality of electronic packages 1 of FIG. 1.

FIG. 17 through FIG. 28 illustrate a method for manufacturing an electronic package according to some embodiments of the present disclosure. In some embodiments, the method is for manufacturing the electronic package 1a shown in FIG. 3.

Figure 17:
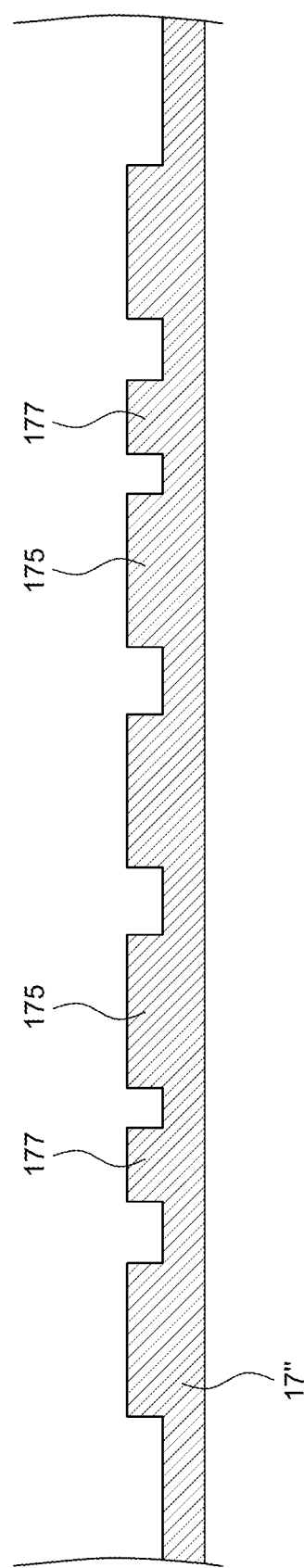
FIG. 17 illustrates one or more stages of an example of a method for manufacturing an electronic package according to some embodiments of the present disclosure.

Referring to FIG. 17 through FIG. 22, a carrier 10" is provided. Referring to FIG. 17, a metal plate 17" is provided. Then, a plurality of protrusions (including, for example, first protrusions 175 and second protrusions 177) are formed on the metal plate 17" by, for example, etching.

Figure 18:
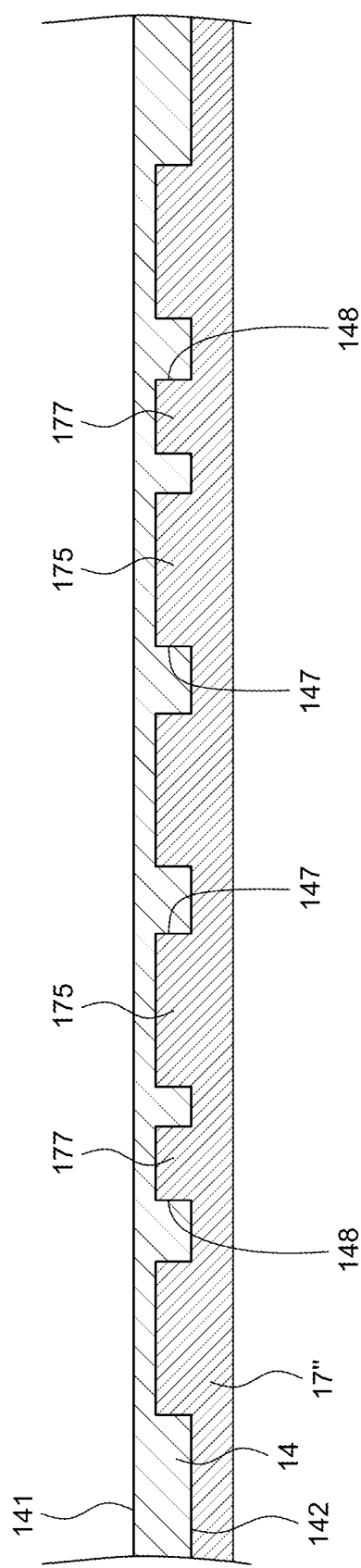
FIG. 18 illustrates one or more stages of an example of a method for manufacturing an electronic package according to some embodiments of the present disclosure.

Referring to FIG. 18, a dielectric layer 14 is formed on the metal plate 17" to cover the protrusions (including, for example, the first protrusions 175 and the second protrusions 177). Meanwhile, a plurality of accommodating cavities (including, for example, first accommodating cavities 147 and second accommodating cavities 148) are formed on the dielectric layer 14 through the protrusions (including, for example, the first protrusions 175 and the second protrusions 177). The dielectric layer 14 may be made of a cured photoimageable dielectric (PID) material such as epoxy or polyimide (PI) including photoinitiators. The dielectric layer 14 has a top surface 141 and a bottom surface 142 opposite to the top surface 141.

Figure 19:
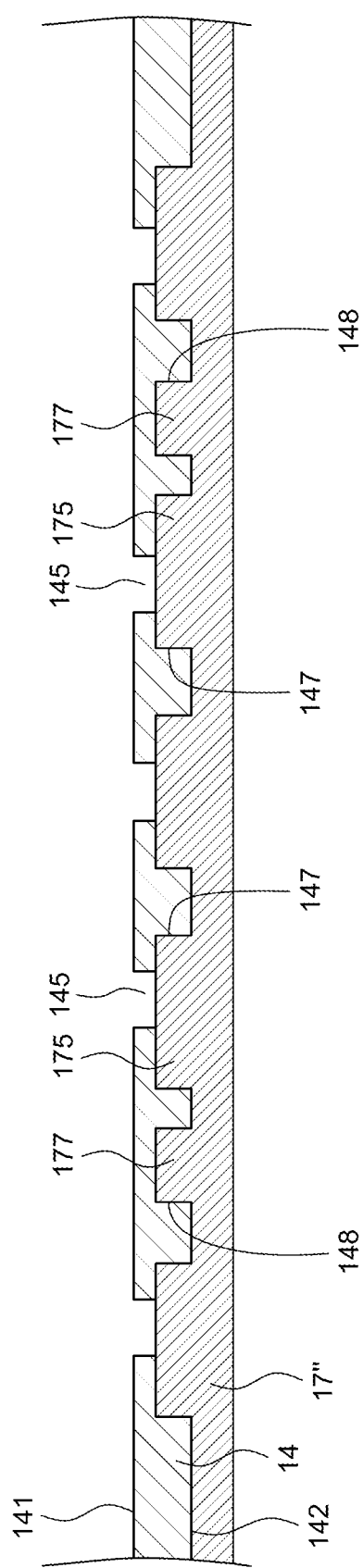
FIG. 19 illustrates one or more stages of an example of a method for manufacturing an electronic package according to some embodiments of the present disclosure.

Referring to FIG. 19, the dielectric layer 14 is patterned to form a plurality of openings 145 extending through the dielectric layer 14 to expose portions (e.g., portions of the first protrusions 175) of the metal plate 17" by an exposure and development technique or other suitable techniques.

Figure 20:
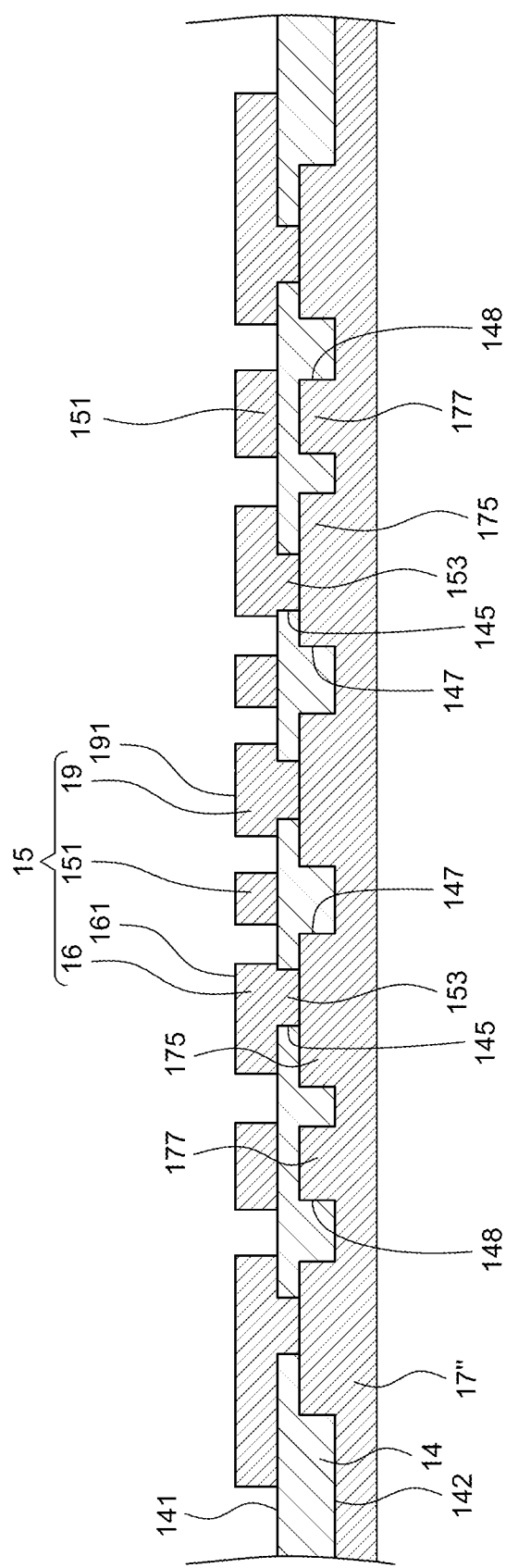
FIG. 20 illustrates one or more stages of an example of a method for manufacturing an electronic package according to some embodiments of the present disclosure.

Referring to FIG. 20, a first circuit layer 15 and a plurality of inner vias 153 are formed. The first circuit layer 15 is formed on the top surface 141 of the dielectric layer 14. The first circuit layer 15 includes at least one trace 151 and a plurality of pads (including, for example, first pads 16 and second pads 19) spaced apart from each other. The inner vias 153 are formed in the openings 145 of the dielectric layer 14 and on the exposed portions (e.g., the exposed portions of the first protrusions 175) of the metal plate 17". In addition, the inner vias 153 are electrically connected to the pads (including, for example, the first pads 16 and the second pads 19).

Figure 21:
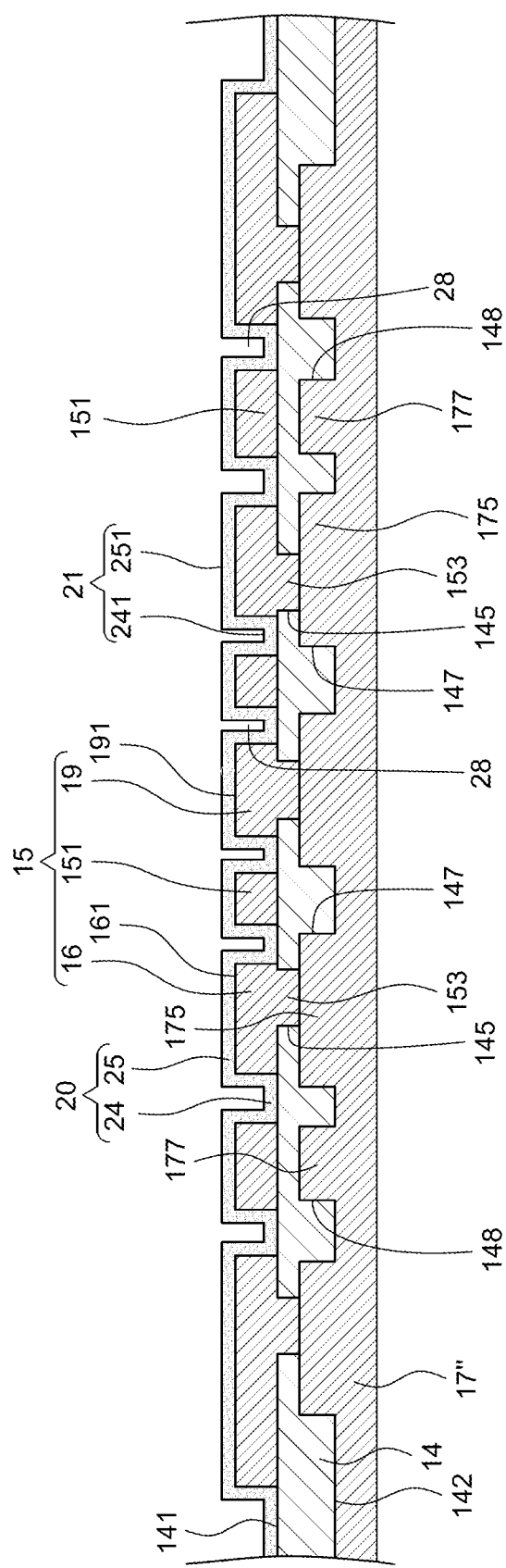
FIG. 21 illustrates one or more stages of an example of a method for manufacturing an electronic package according to some embodiments of the present disclosure.

Referring to FIG. 21, a first protection layer 20 is formed on the dielectric layer 14 to cover the top surface 141 of the dielectric layer 14 and the first circuit layer 15 (including, for example, the trace 151, the first pads 16 and the second pads 19) by, for example, chemical vapor deposition (CVD). A material of the first protection layer 20 may include poly-p-xylylene (also referred to as "parylene"). In addition, a hygroscopicity of the first protection layer 20 is less than a hygroscopicity of the dielectric layer 14 so as to solve the popcorn and delamination problems in thermal processes, lead to increased reliability.

The first protection layer 20 includes a first portion 24 and a second portion 25. The first portion 24 covers the top surface 141 of the dielectric layer 14. The second portion 25 covers the first circuit layer 15 (including, for example, the trace 151, the first pads 16 and the second pads 19). Thus, the first portion 24 is lower than the second portion 25. In addition, the first protection layer 20 has an upper surface 21 (including, for example, a top surface 241 of the first portion 24 and a top surface 251 of the second portion 25). A portion (e.g., the top surface 241 of the first portion 24) of the upper surface 21 of the first protection layer 20 is lower than a top surface (including, for example, a top surface 161 of the first pad 16 and a top surface 191 of the second pad 19) of each of the pads (including, for example, the first pads 16 and the second pads 19). Further, as shown in FIG. 21, at least one recess 28 is formed between the pads (e.g., between the first pad 16 and the second pad 19). The recess 28 is above the first portion 24 of the first protection layer 20.

As shown in FIG. 4, a thickness $t_1$ of the first protection layer 20 is less than a thickness $t_3$ of the first circuit layer 15 (including, for example, the trace 151, the first pads 16 and the second pads 19) and a thickness t of the dielectric layer 14. Thus, as shown in FIG. 21, the first protection layer 20 is substantially conformal with a profile of the first circuit layer 15. That is, the first protection layer 20 is substantially conformal with a profile of the trace 151, profiles of the first pads 16 and profiles of the second pads 19.

Figure 22:
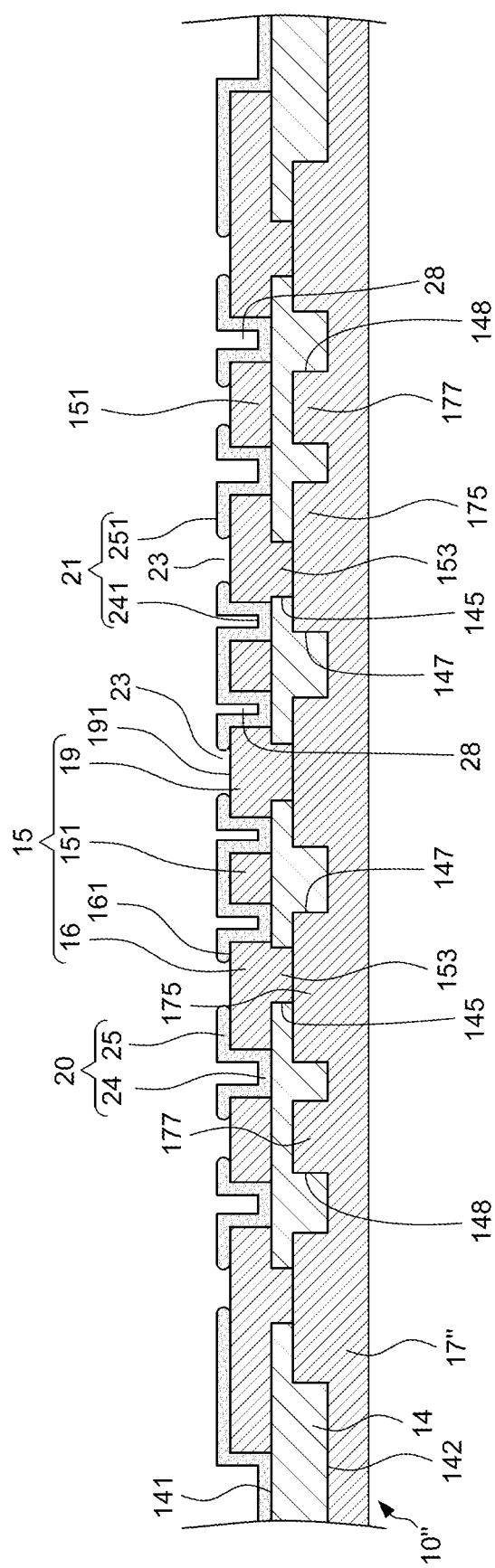
FIG. 22 illustrates one or more stages of an example of a method for manufacturing an electronic package according to some embodiments of the present disclosure.

Referring to FIG. 22 and FIG. 4, the first protection layer 20 is patterned to form a plurality of first openings 23 extending through the first protection layer 20 (e.g., the second portion 25) to expose portions of the pads (including, for example, the first pads 16 and the second pads 19) by, for example, laser drilling. Meanwhile, the carrier 10" is formed. As shown in FIG. 4, a sidewall 230 of each of the first openings 23 curves inward due to laser drilling. In addition, each of the first openings 23 includes an upper portion 231 and a lower portion 232 opposite to the upper portion 231. The upper portion 231 tapers downward, and the lower portion 232 tapers upward. That is, a width of the upper portion 231 gradually decreases toward the corresponding pad (e.g., the first pad 16), and a width of the lower portion 232 gradually increases toward the corresponding pad (e.g., the first pad 16). Further, the sidewall 230 of each of the first openings 23 and the top surface (including, for example, the top surface 161 and the top surface 191) of each of the pads (including, for example, the first pads 16 and the second pads 19) define a recession $C_1$.

Figure 23:
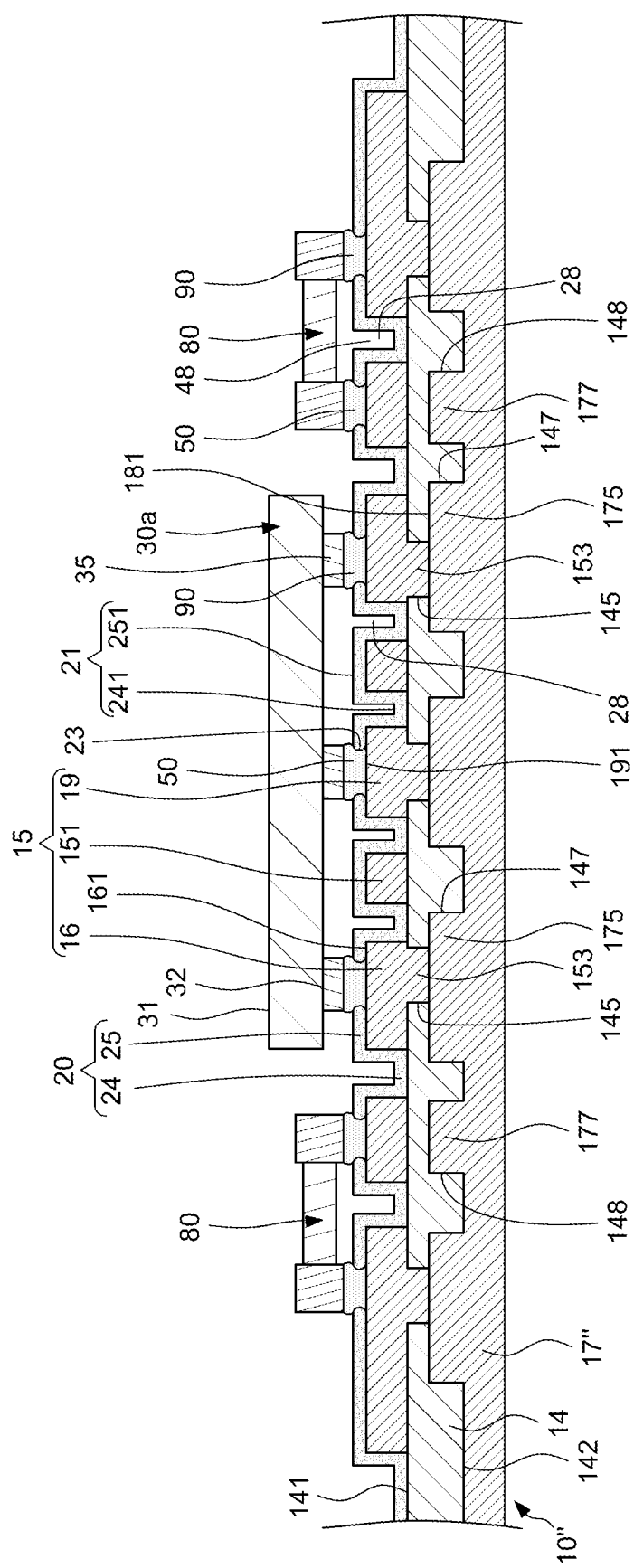
FIG. 23 illustrates one or more stages of an example of a method for manufacturing an electronic package according to some embodiments of the present disclosure.

Referring to FIG. 23 and FIG. 4, a plurality of electronic components (including, for example, one first electronic component 30a and two second electronic components 80) are electrically connected to the exposed portions of the pads (including, for example, the first pads 16 and the second pads 19) of the first circuit 15 by a plurality of interconnections (including, for example, first interconnections 50 and second interconnections 90). The first electronic component 30a may be, for example, a semiconductor die. The second electronic components 80 may be, for example, a resister, a capacitor or an inductor. As shown in FIG. 4, the interconnections (including, for example, the first interconnections 50 and the second interconnections 90) extend into the recessions C₁ to engage with the first protection layer 20.

Figure 24:
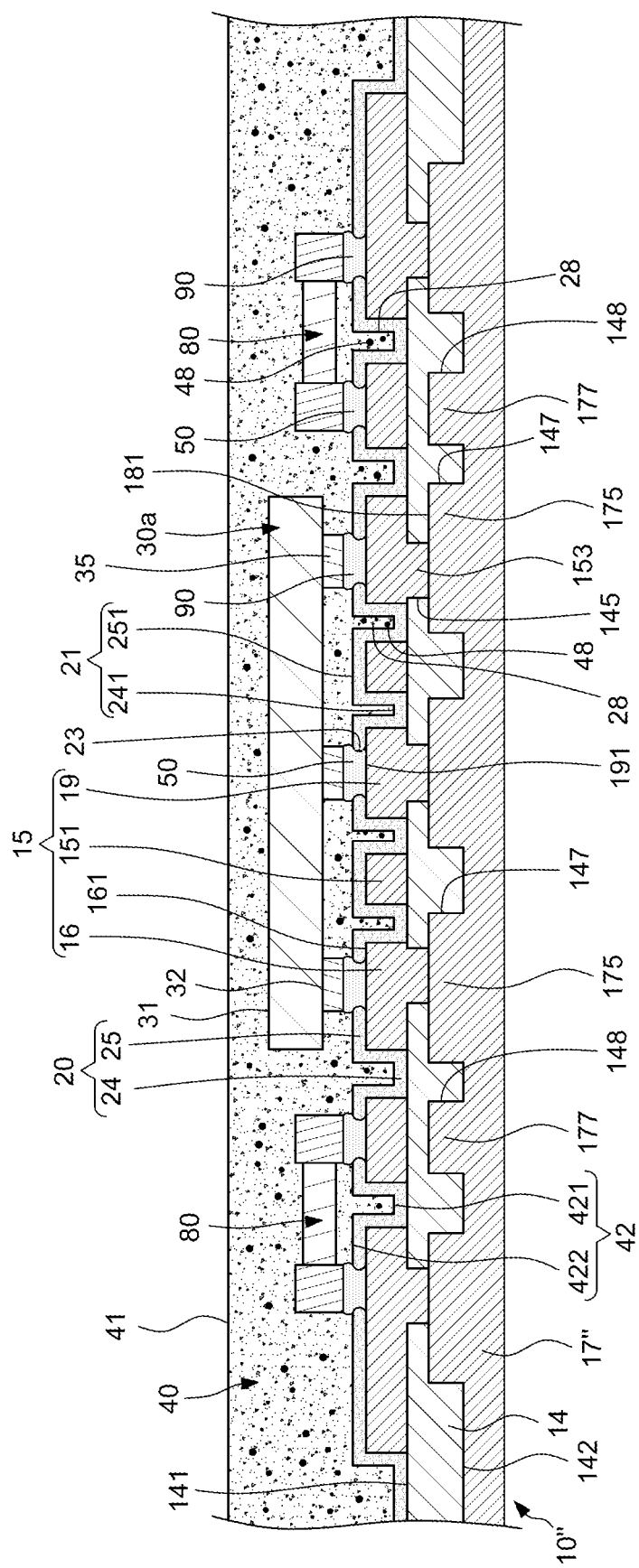
FIG. 24 illustrates one or more stages of an example of a method for manufacturing an electronic package according to some embodiments of the present disclosure.

Referring to FIG. 24, an encapsulant 40 is formed to encapsulate the electronic components (including, for example, one first electronic component 30a and two second electronic components 80), the first protection layer 20 and the interconnections (including, for example, the first interconnections 50 and the second interconnections 90). A material of the encapsulant 40 may be a molding compound with or without fillers. A portion of the encapsulant 40 extends between the pads (e.g., between the first pad 16 and the second pad 19) and into the recess 28 of the first protection layer 20. That is, the portion of the encapsulant 40 fills the recess 28. The encapsulant 40 has an upper surface 41 and a lower surface 42 opposite to the upper surface 41. The lower surface 42 of the encapsulant 40 includes a first portion 421 and a second portion 422 higher than the first portion 421. The first portion 421 of the lower surface 42 is lower than the top surface (including, for example, the top surface 161 and the top surface 191) of each of the pads (including, for example, the first pads 16 and the second pads 19) and substantially coplanar with the top surface 241 of the first portion 24 of the first protection layer 20. The second portion 422 of the lower surface 42 is substantially coplanar with the top surface 251 of the second portion 25 of the first protection layer 20.

Figure 25:
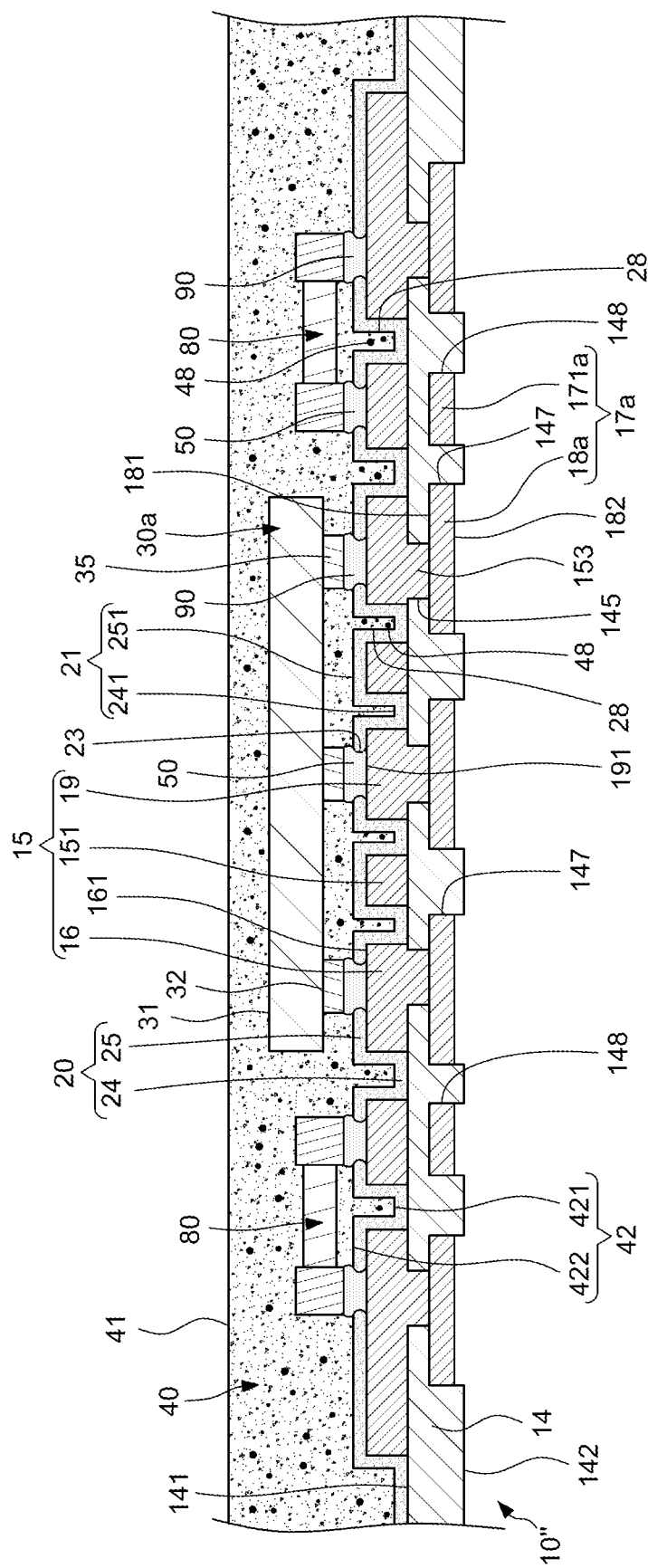
FIG. 25 illustrates one or more stages of an example of a method for manufacturing an electronic package according to some embodiments of the present disclosure.

Referring to FIG. 25, a portion (e.g., portions below the first protrusions 175 and the second protrusions 177, portions of the first protrusions 175 and portions of the second protrusions 177) of the metal plate 17″ is removed to form a second circuit layer 17a and expose the bottom surface 142 of the dielectric layer 14 by, for example, etching. The second circuit layer 17a includes at least one trace 171a and a plurality of bonding pads 18a. The bonding pads 18a are formed in the first accommodating cavities 147 of the dielectric layer 14 and electrically connect or contact the inner vias 153 in the openings 145. A thickness of each of the bonding pads 18a is less than a depth of each of the first accommodating cavities 147. Thus, the bonding pads 18a are higher than the bottom surface 142 of the dielectric layer 14 and between the top surface 141 and the bottom surface 142 of the dielectric layer 14. That is, a bottom surface 182 of each of the bonding pads 18a is non-coplanar with the bottom surface 142 of the dielectric layer 14. The trace 171a is formed in the second accommodating cavity 148 of the dielectric layer 14. A thickness of the trace 171a is less than a depth of the second accommodating cavity 148. Thus, the trace 171a is higher than the bottom surface 142 of the dielectric layer 14 and between the top surface 141 and the bottom surface 142 of the dielectric layer 14. That is, a bottom surface of the trace 171a is non-coplanar with the bottom surface 142 of the dielectric layer 14.

Figure 26:
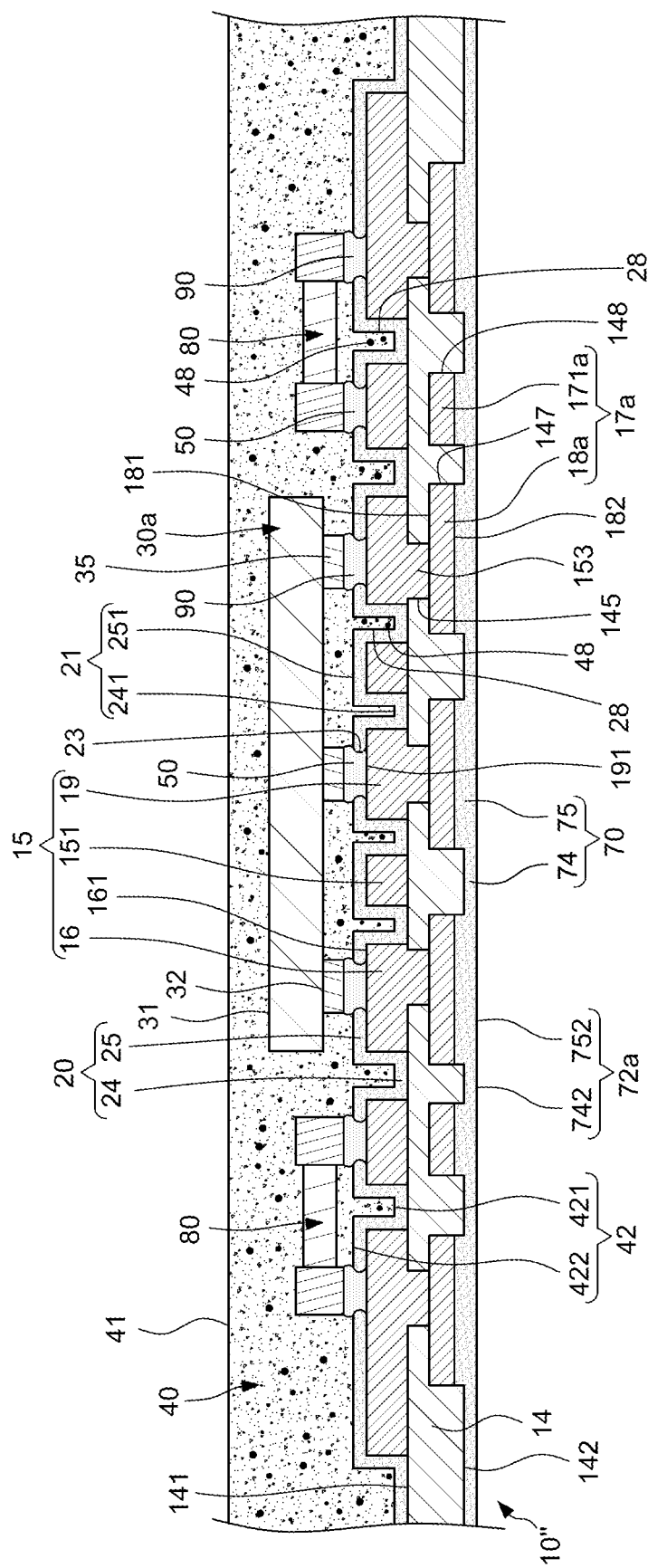
FIG. 26 illustrates one or more stages of an example of a method for manufacturing an electronic package according to some embodiments of the present disclosure.

Referring to FIG. 26, a second protection layer 70 is formed to cover the bottom surface 142 of the dielectric layer 14 and the second circuit layer 17a (including, for example, the trace 171a and the bonding pads 18a) by, for example, chemical vapor deposition (CVD). A material of the second protection layer 70 may include poly-p-xylylene (also referred to as "parylene"). In addition, a hygroscopicity of the second protection layer 70 is less than the hygroscopicity of the dielectric layer 14 so as to solve the popcorn and delamination problems in thermal processes, lead to increased reliability.

As shown in FIG. 4, the second protection layer 70 includes a first portion 74 and a second portion 75. The first portion 74 covers the bottom surface 142 of the dielectric layer 14. The second portion 75 at least partially covers the second circuit layer 17a (including, for example, the trace 171a and the bonding pads 18a). As shown in FIG. 26, a lower surface 72a of the second protection layer 70 is a flat surface. That is, the bottom surface 742 of the first portion 74 is substantially coplanar with the bottom surface 752 of the second portion 75.

Figure 27:
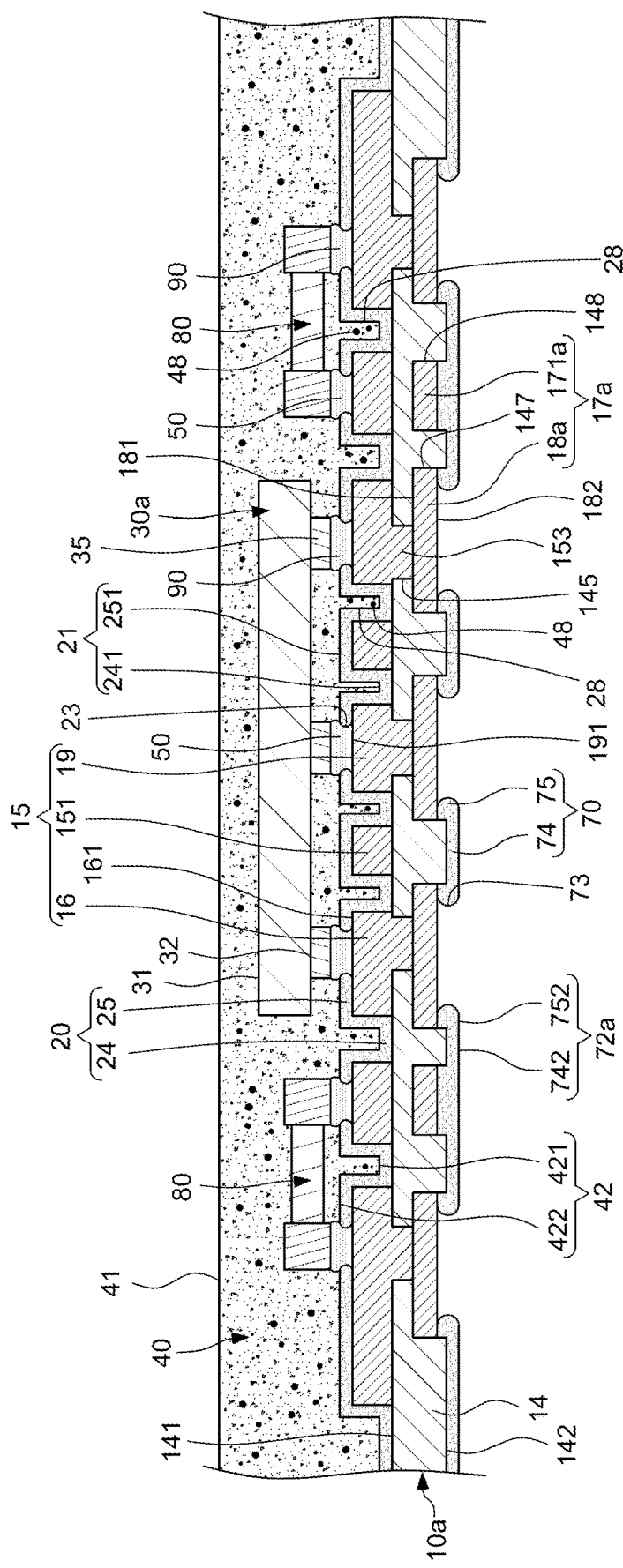
FIG. 27 illustrates one or more stages of an example of a method for manufacturing an electronic package according to some embodiments of the present disclosure.
Figure 28:
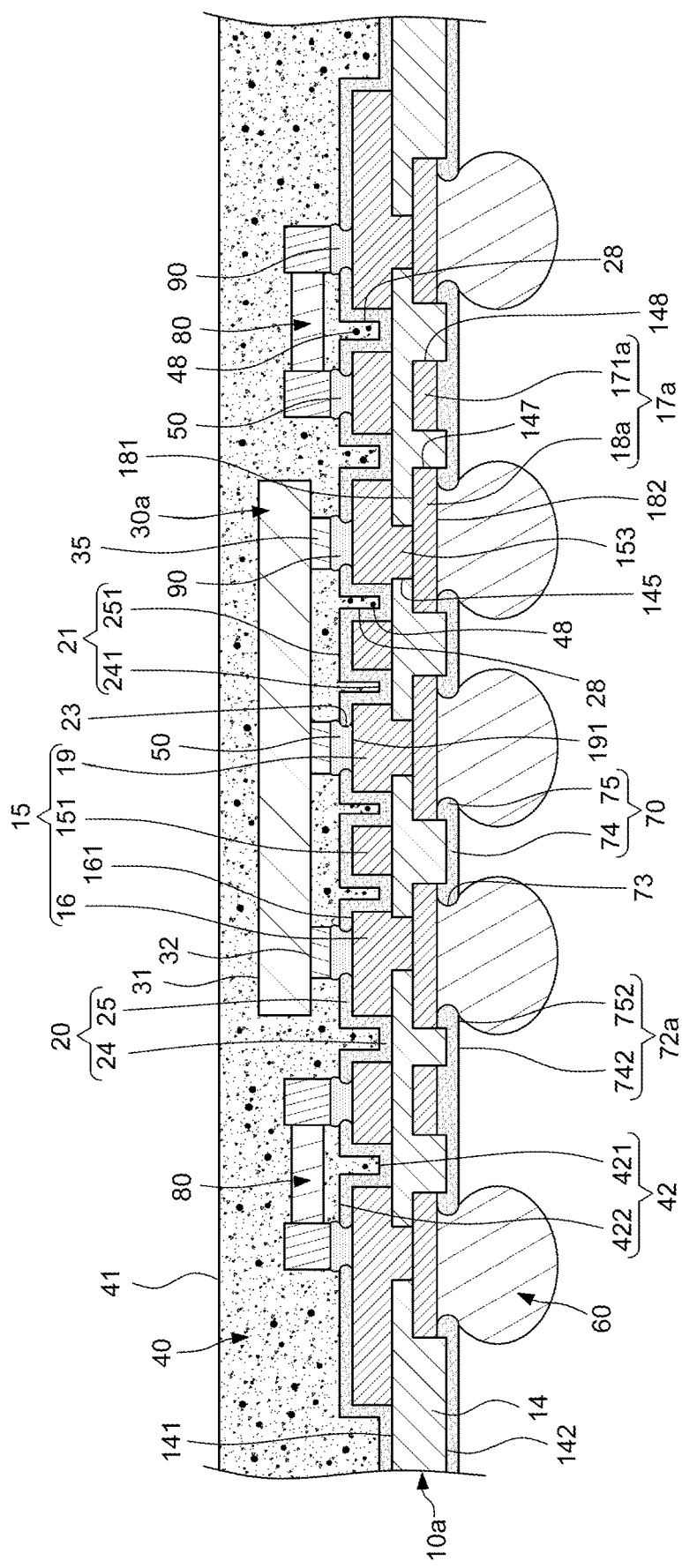
FIG. 28 illustrates one or more stages of an example of a method for manufacturing an electronic package according to some embodiments of the present disclosure.

The stages illustrated in FIG. 27 through FIG. 28. are the same as, or similar to, the stages illustrated in FIG. 15 through FIG. 16. Then, a singulation process is conducted to obtain a plurality of electronic packages 1a of FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
   a carrier including a dielectric layer and a pad in contact with the dielectric layer;
   a protection layer including a first portion extending over a top surface of the pad, and defining a recess; and
   an electronic component located over the protection layer and electrically connected to the pad through an interconnection element, wherein the interconnection element includes a solder material having a top surface higher than a top surface of the protection layer and a bottom surface lower than the top surface of the protection layer with respect to a top surface of the carrier;
   wherein the interconnection element does not vertically overlap the recess of the protection layer.

2. The electronic package of claim 1, wherein the interconnection element laterally overlaps the recess of the protection layer.

3. The electronic package of claim 1, further comprising an encapsulant including a plurality of fillers in the recess of the protection layer, wherein a dimension of each of the plurality of fillers is less than a depth of the recess of the protection layer.

4. The electronic package of claim 1, wherein the top surface of the protection layer is higher than the top surface of the pad with respect to the top surface of the carrier.

5. The electronic package of claim 1, wherein the first portion of the protection layer has a lateral surface, and the lateral surface has a curved surface.

6. The electronic package of claim 1, wherein the protection layer includes parylene.

7. The electronic package of claim 1, wherein the interconnection element has a curved side surface.

8. The electronic package of claim 7, wherein the curved side surface of the interconnection element includes a first portion curved inward and a second portion curved outward.

9. The electronic package of claim 8, further comprising an encapsulant filled in a spandrel defined by the second portion of the curved side surface of the interconnection element and a top surface of the protection layer.

10. The electronic package of claim 8, wherein the curved side surface of the interconnection element includes an inflection point defined by the first portion and the second portion of the curved side surface is substantially aligned with an intersection between the curved side surface of the interconnection element and a top surface of the protection layer.

11. The electronic package of claim 1, wherein, in a cross-sectional view, the solder material further has a maximum horizontal width less than a horizontal width of the top surface of the pad.

12. The electronic package of claim 1, wherein the solder material at least partially overlaps the protection layer.

13. The electronic package of claim 1, wherein the protection layer defines an opening over the pad, wherein a width of the opening is less than a width of the pad in a cross-sectional view.

14. The electronic package of claim 13, wherein the opening exposes a portion of the pad, and an inner sidewall of the protection layer defining the opening curves inward.

15. The electronic package of claim 14, wherein a portion of the interconnection element fills in the opening and in a spandrel defined between the inner sidewall of the protection layer and the top surface of the pad.

16. An electronic package, comprising:
    a carrier including a dielectric layer and a pad in contact with the dielectric layer;
    a protection layer including a first portion extending over a top surface of the pad, and defining a recess; and
    an electronic component located over the protection layer and electrically connected to the pad through an interconnection element;
    wherein the interconnection element does not vertically overlap the recess of the protection layer;
    wherein the carrier further includes a trace covered by the protection layer and adjacent to the recess, and a width of the recess of the protection layer is greater than a width of the trace in a cross-sectional view, wherein a bottom of the recess of the protection layer is lower than a top surface of the trace with respect to a top surface of the carrier.

17. The electronic package of claim 16, wherein the width of the trace is narrower than a width of the pad in the cross-sectional view.

18. An electronic package, comprising:
    a carrier including a dielectric layer and a pad in contact with the dielectric layer;
    a protection layer including a first portion extending over a top surface of the pad, and defining a recess, wherein the protection layer further includes a second recess, the recess and the second recess are between the pad and a second pad adjacent to the pad, and a width of the recess is narrower than a second width of the second recess; and
    an electronic component located over the protection layer and electrically connected to the pad through an interconnection element;

wherein the interconnection element does not vertically overlap the recess of the protection layer.

* * * * *